(12) United States Patent
Korb

(10) Patent No.: US 8,347,740 B2
(45) Date of Patent: Jan. 8, 2013

(54) SYSTEMS FOR WEIGHING A PULLED OBJECT HAVING A CHANGING WEIGHT

(75) Inventor: Harold Korb, Chesterfield, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 359 days.

(21) Appl. No.: 12/726,973

(22) Filed: Mar. 18, 2010

(65) Prior Publication Data

US 2010/0242625 A1  Sep. 30, 2010

Related U.S. Application Data

(60) Provisional application No. 61/165,285, filed on Mar. 31, 2009, provisional application No. 61/165,291, filed on Mar. 31, 2009, provisional application No. 61/165,294, filed on Mar. 31, 2009, provisional application No. 61/234,472, filed on Aug. 17, 2009, provisional application No. 61/262,666, filed on Nov. 19, 2009.

(51) Int. Cl.
   *G01L 5/04* (2006.01)
(52) U.S. Cl. .................................................. 73/862.42
(58) Field of Classification Search ............. 73/862.42
   See application file for complete search history.

(56) References Cited

U.S. PATENT DOCUMENTS

| | | | |
|---|---|---|---|
| 3,339,652 A | 9/1967 | Price | |
| 4,916,955 A | 4/1990 | Katsuoka et al. | |
| 5,106,593 A * | 4/1992 | Mizuishi et al. ............. | 117/215 |
| 5,240,684 A | 8/1993 | Baba et al. | |
| 5,582,642 A * | 12/1996 | Korb et al. ..................... | 117/218 |
| 5,763,838 A | 6/1998 | Morimura et al. | |
| 5,964,941 A * | 10/1999 | Iino et al. ......................... | 117/13 |
| 6,051,064 A | 4/2000 | Labrie | |
| 6,068,699 A | 5/2000 | Tsuji et al. | |
| 6,113,686 A * | 9/2000 | Iino et al. ......................... | 117/13 |
| 6,228,167 B1 * | 5/2001 | Kuramoto et al. ............ | 117/208 |

FOREIGN PATENT DOCUMENTS

| | | |
|---|---|---|
| DE | 10007265 A1 | 8/2001 |
| EP | 0303977 A2 | 2/1989 |
| JP | 63303888 | 12/1988 |
| JP | 07172980 | 7/1995 |

OTHER PUBLICATIONS

Invitation to Pay Additional Fees and Partial International Search Report dated Aug. 23, 2010 from Application No. PCT/US2010/028093 filed on Mar. 22, 2010; 5 pages.

International Search Report based on PCT/US2010/028093 dated Nov. 4, 2010; 6 pages.

\* cited by examiner

*Primary Examiner* — Lisa Caputo
*Assistant Examiner* — Octavia Davis-Hollington
(74) *Attorney, Agent, or Firm* — Armstrong Teasdale LLP

(57) ABSTRACT

A system for measuring the weight of an object while pulling the object upward includes a puller having a frame and a cable having a first end coupled to the object and a second end engaging a second cylinder. At least a portion of the cable engages the outer circumferential surface of a first cylinder and the second cylinder. The apparatus also includes an upper arm and an actuator. A force measurement device is coupled to the first cylinder and to the upper arm and measures the weight of the object. The actuator is operable to lower and raise the weight measurement device and the first cylinder. In some embodiments, the position of the cable with respect to the frame may be adjusted by a dampening system or a bushing.

27 Claims, 32 Drawing Sheets

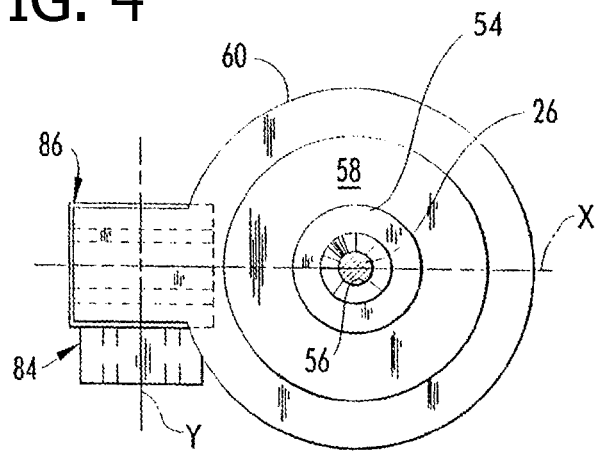
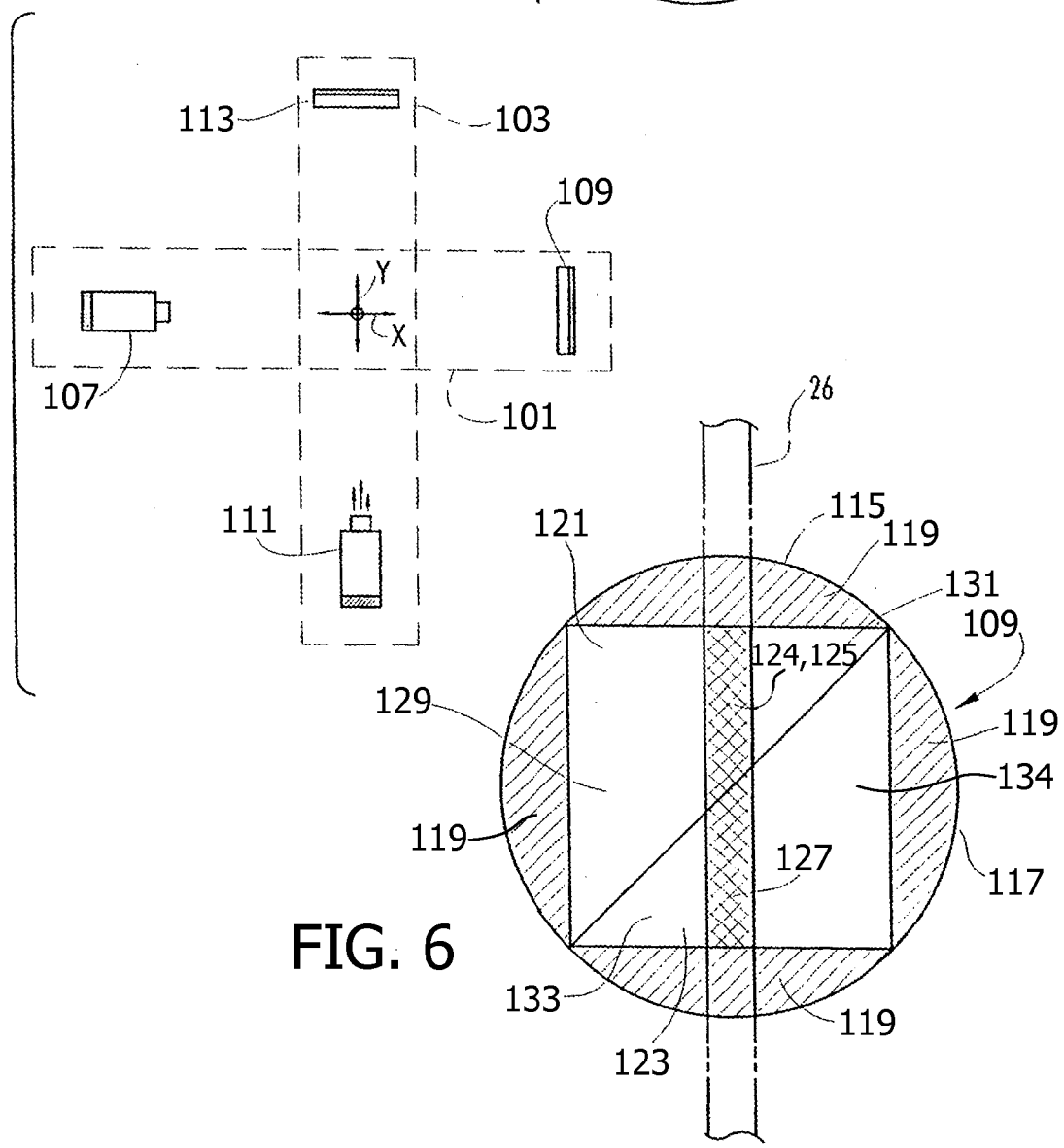

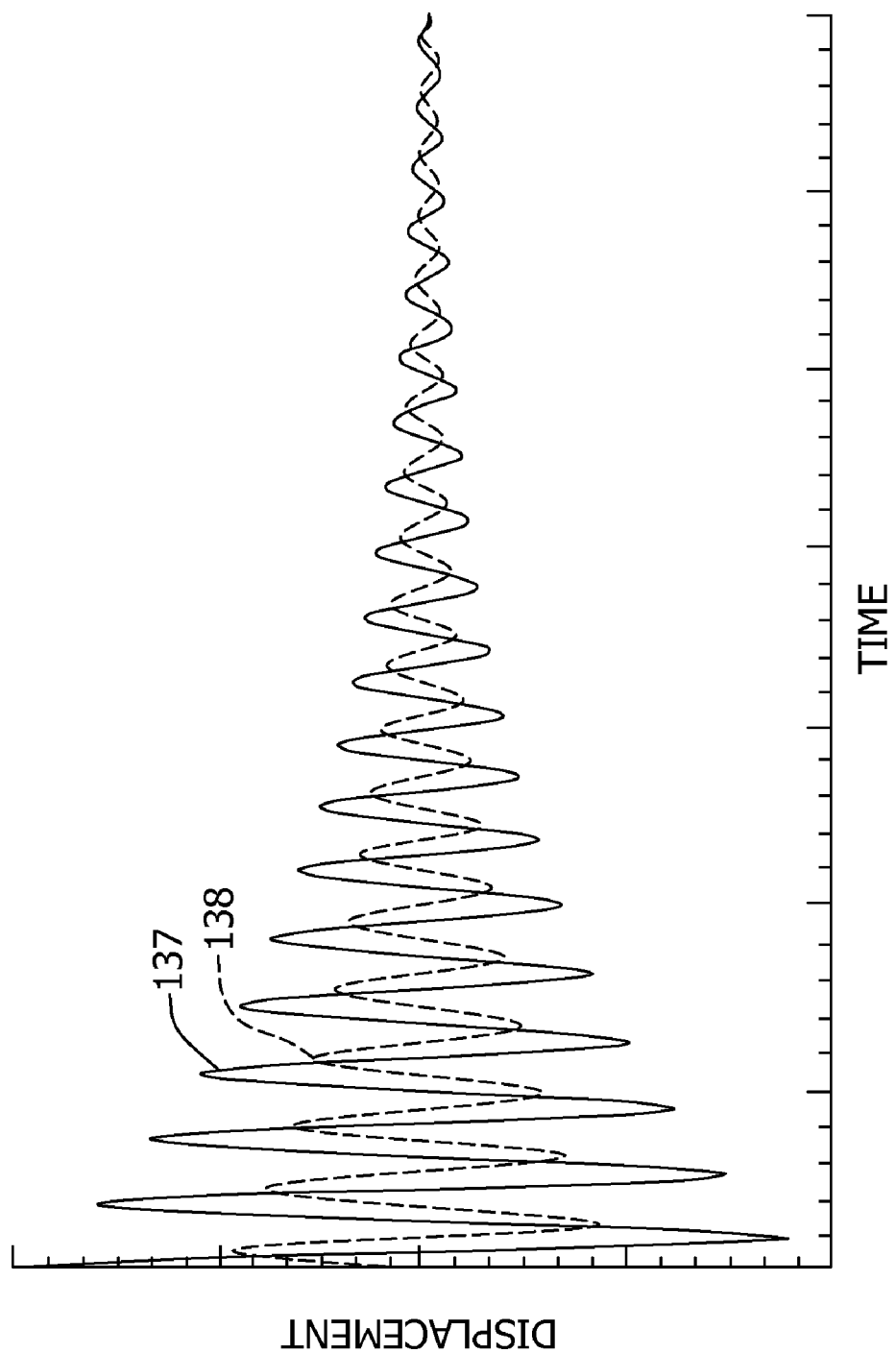

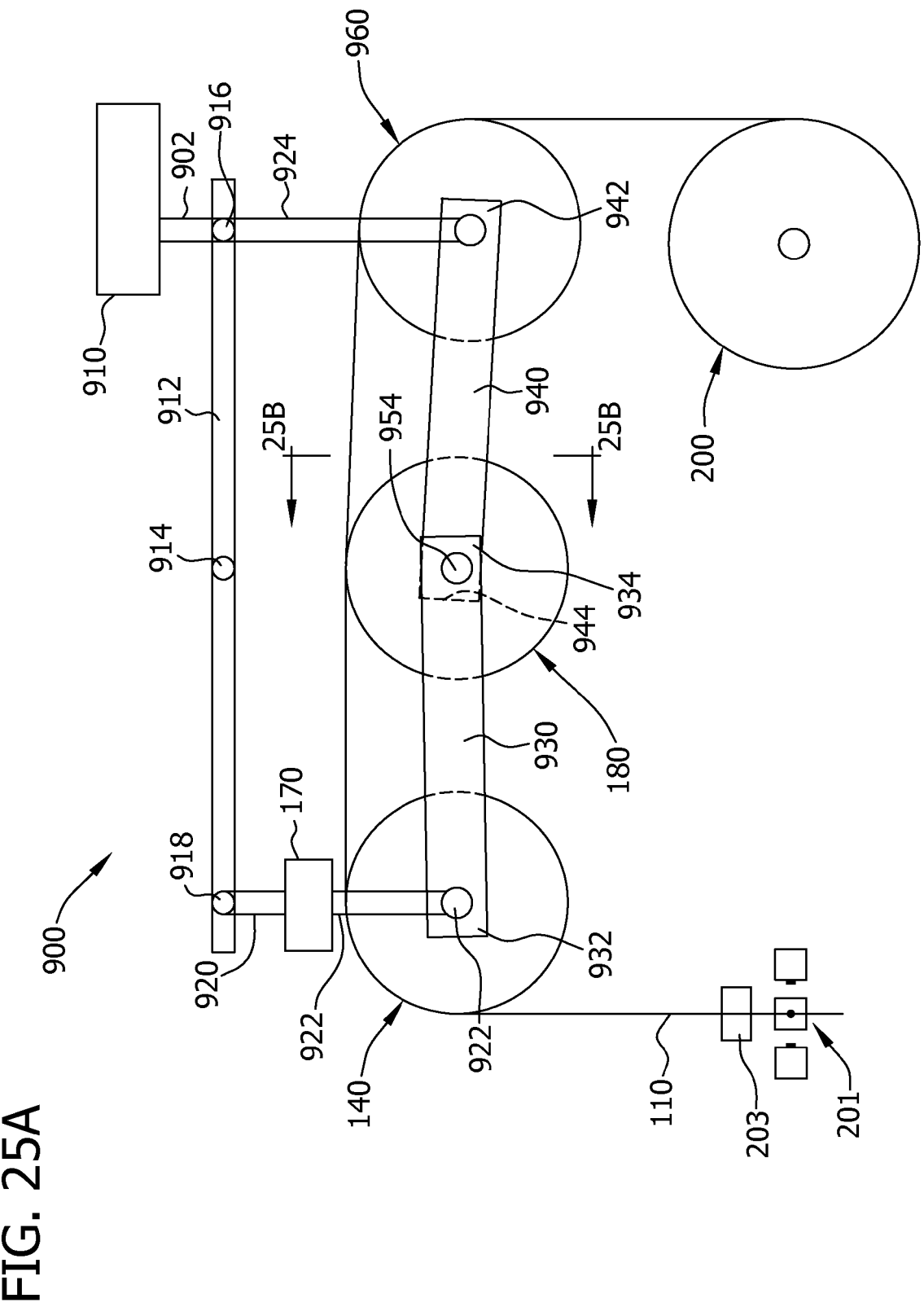

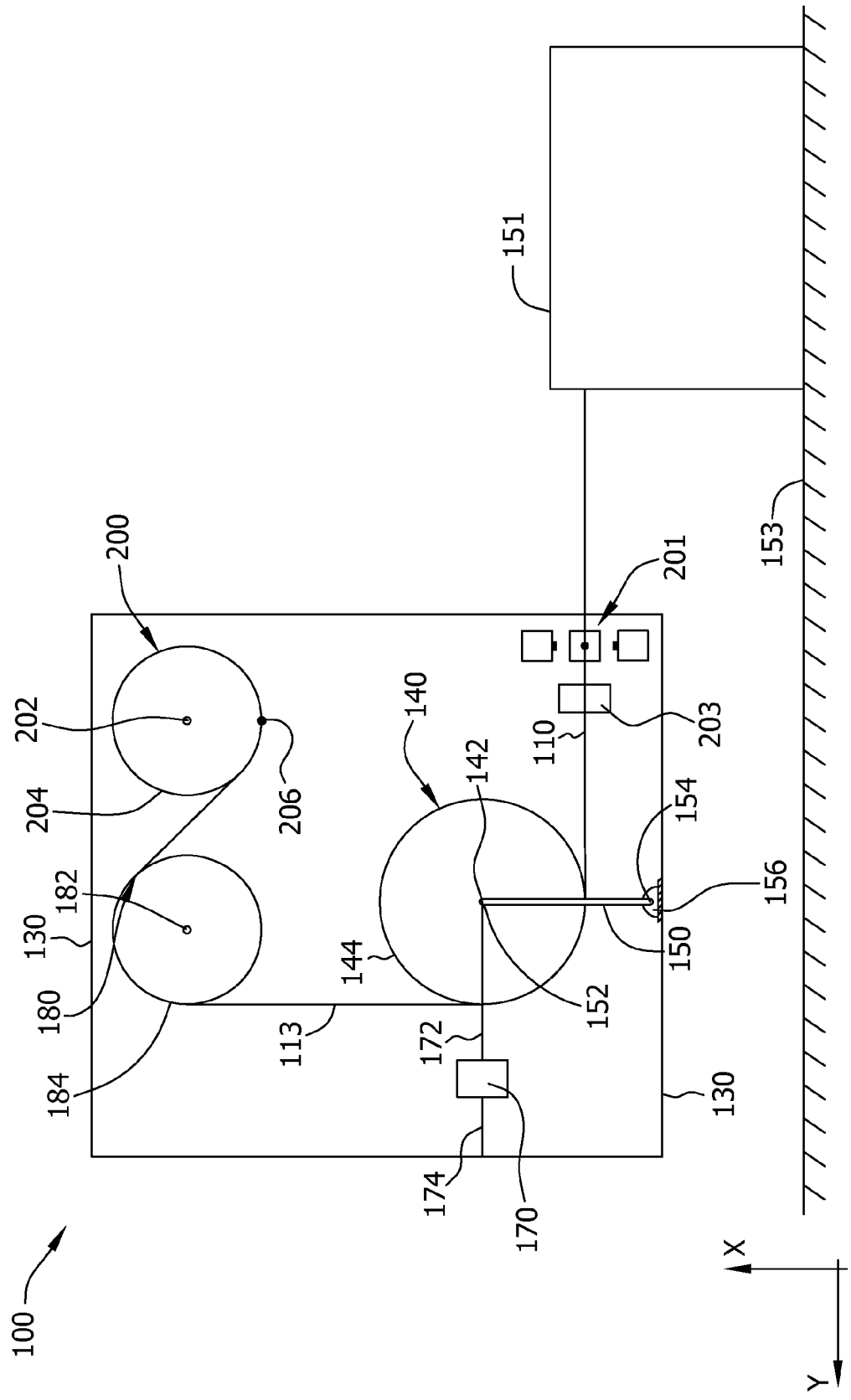

SYSTEMS FOR WEIGHING A PULLED OBJECT HAVING A CHANGING WEIGHT

CROSS-REFERENCE TO RELATED APPLICATIONS

This application claims priority to U.S. Provisional Application Nos. 61/165,285; 61/165,291; 61/165,294, all filed Mar. 31, 2009; Application No. 61/234,472, filed Aug. 17, 2009; and Application No. 61/262,666, filed Nov. 19, 2009.

FIELD OF THE DISCLOSURE

The field of the disclosure relates generally to systems for measuring the weight of an object suspended from a cable and, more specifically, to systems for measuring the weight of an object having a changing weight.

BACKGROUND

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In previous systems, an object is weighed by attaching the object to a first end of a cable. The cable is pulled upward by routing the cable over a pulley and then wrapping the cable around a drum driven by a drive. The pulley is suspended from a load cell. The weight of the object is determined by analyzing the force applied to the load cell by the pulley. In theory, the force exerted on the pulley by the cable is equal to some multiple of the weight of the object.

Accurately measuring the weight of an object suspended from a cable is useful in a variety of applications. One example is silicon ingot growth operations, where a growing silicon ingot is pulled upward from a crucible of molten silicon. The diameter of the region of the silicon ingot being grown at any instant may be determined based on the density, rate of change of weight, and growth velocity of the ingot. While the density and growth velocity of the ingot are readily determinable to a high degree of accuracy, the rate of change of weight of the ingot is not measurable with a high enough degree of accuracy by previous systems to ensure a correct determination of the ingot diameter. The inherent inaccuracies of previous force measurement systems described above thus render them ill-suited for determining the diameter of a growing silicon ingot based on the weight of the ingot. Known systems therefore utilize more costly and less accurate systems for determining the diameter of the growing silicon ingot.

Moreover, orbital and/or pendular motion of the cable can affect the amount of force exerted on the load cell by the cable and thus affect the force measurement. Orbital and/or pendular motion of the cable can also prevent the ingot from growing in a straight direction and restrict the rate at which the ingot can be rotated.

BRIEF SUMMARY

One aspect is an apparatus for measuring the weight of an object while pulling the object upward. The apparatus comprises a frame having a vertical axis and a horizontal axis, the vertical axis parallel to an axis along which the object is pulled, the horizontal axis being orthogonal to the vertical axis. A cable coupled to the object. A first cylinder is rotatably connected to the frame and at least a portion of the cable engages a surface of the first cylinder. A second cylinder is rotatably connected to the frame and at least a portion of the cable engages a surface of the second cylinder. An upper arm has a first end, a second end and the upper arm is coupled to the frame. A lower arm is coupled at one end to the first cylinder and at another end to the frame. An actuator is coupled to the upper arm. A force measurement device measures the weight of the object. The force measurement device is coupled to the first cylinder. The actuator is operable to lower and raise the force measurement device, the first cylinder, and the second cylinder. The lower arm substantially restrains the first cylinder from movement parallel to the horizontal axis.

Another aspect is an apparatus for measuring the weight of an object while pulling the object upward. The apparatus comprises a frame having a vertical axis and a horizontal axis, the vertical axis parallel to an axis along which the object is pulled, the horizontal axis being orthogonal to the vertical axis. A cable is coupled to the object. A mounting member has a lower section and an upper section. The mounting member is pivotably coupled at the lower section to the frame. A first cylinder is within the frame and at least a portion of the cable engages a surface of the first cylinder. A second cylinder is within the frame and at least a portion of the cable engages a surface of the second cylinder. An upper arm has a first end and a second end and the upper arm is coupled to the mounting member. A lower arm is coupled at one end to the first cylinder and at another end to the frame. An actuator has a first end and a second end, the first end is coupled to the mounting member and the second end is coupled to the first end of the upper arm. A force measurement device measures the weight of the object. The force measurement device is coupled to the first cylinder at a first end and to the second end of the upper arm at a second end. The actuator is operable to raise and lower the force measurement device, the first cylinder, and the second cylinder.

Still another aspect is an apparatus for measuring the weight of an object while pulling the object upward. The apparatus comprises a puller for pulling the object. The puller includes a frame and a cable coupled to the object. A first cylinder is rotatably coupled to the frame and at least a portion of the cable engages the first cylinder. A second cylinder is rotatably coupled to the frame and at least a portion of the cable engages the second cylinder. An arm has a longitudinal axis connecting a first end and a second end. The first end is coupled to the frame and the second end is coupled to the first cylinder. The longitudinal axis is substantially parallel to a path traveled by the cable between the first cylinder and the second cylinder. An actuator has a first end and a second end and the first end coupled to the frame. A force measurement device for measures the weight of the object. The force measurement device is coupled to the first cylinder at a first end and to the second end of the actuator at a second end. The actuator is operable to lower and raise the force measurement device and the first cylinder. The arm substantially restrains the first cylinder from movement parallel to the longitudinal axis of the arm.

Various refinements exist of the features noted in relation to the above-mentioned aspects. Further features may also be incorporated in the above-mentioned aspects as well. These refinements and additional features may exist individually or in any combination. For instance, various features discussed

BRIEF DESCRIPTION OF THE DRAWINGS

FIG. 4 is a cross-section view taken along the plane of the line 4-4 of FIG. 2.

FIG. 5 is a cross-section view taken along the plane of line 5-5 of FIG. 2 schematically showing the first and second position sensors for sensing the position of the pull cable.

FIG. 6 is an enlarged front elevation view of a first masked photodiode assembly of the first position sensor of FIG. 5.

FIG. 7 is a displacement vs. time graph representing dampening of a pull cable.

FIG. 25A is a side view of another embodiment of a pulling system in an initial position.

FIG. 33 is a partially schematic view of a pulling system of another embodiment.

DETAILED DESCRIPTION

Figure 1:
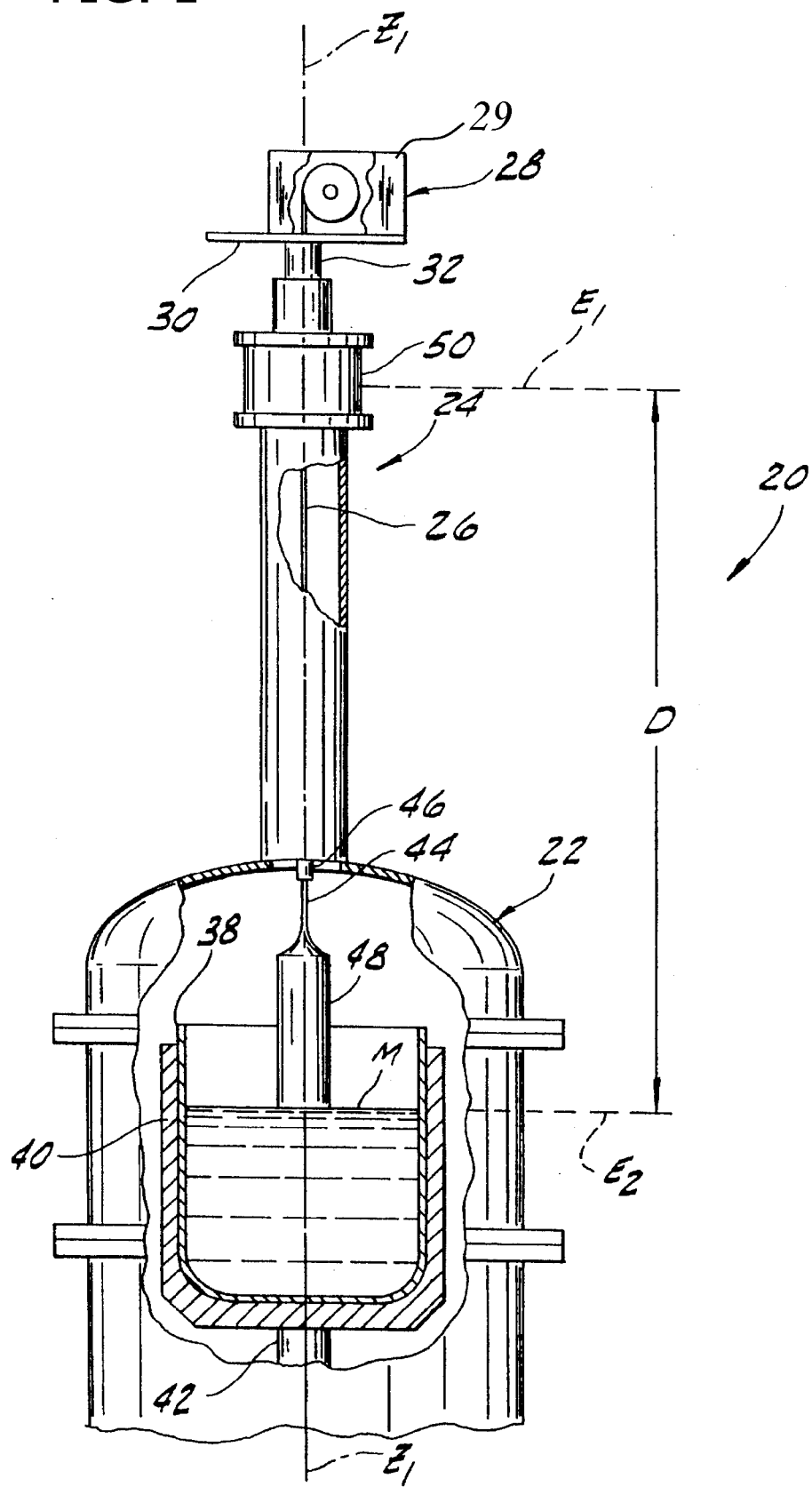
FIG. 1 is a partially schematic side elevation view of a crystal pulling machine having a bushing of one embodiment with portions of the machine broken away to show detail.
Figure 2:
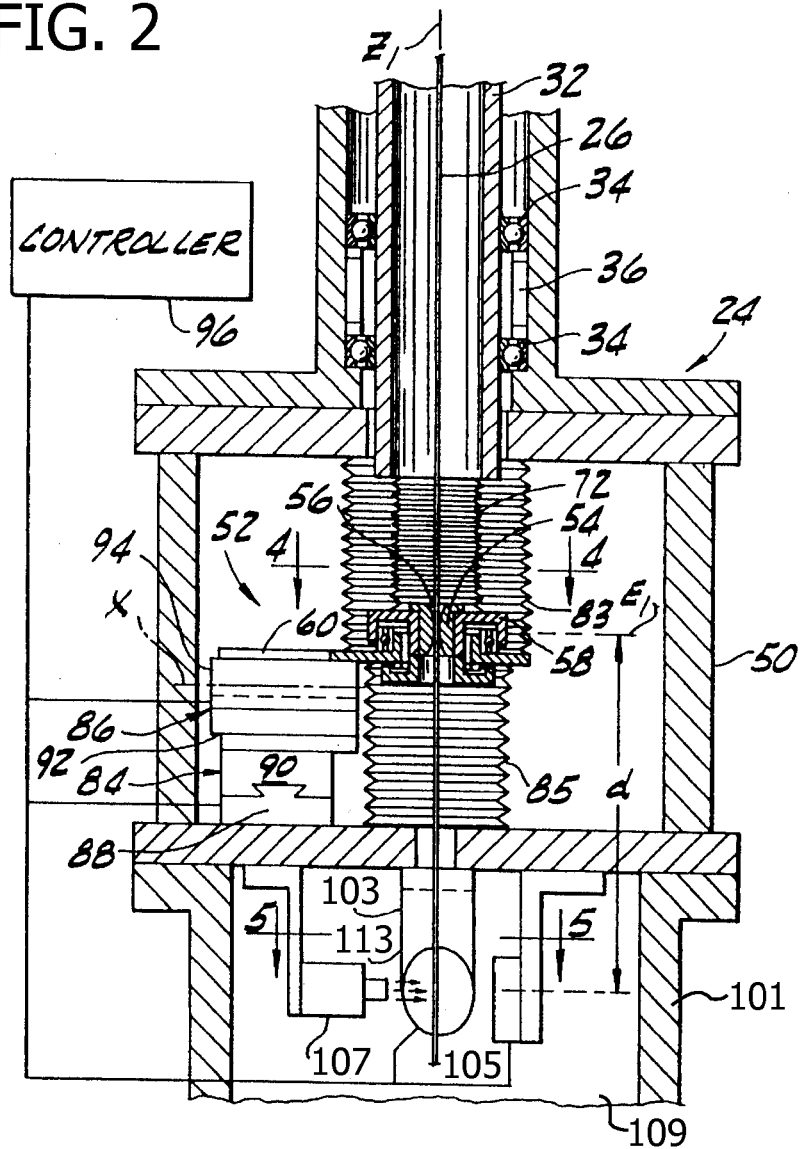
FIG. 2 is an enlarged fragmented section view of the crystal pulling machine of FIG. 1 showing the bushing.

Referring now to the drawings, and an embodiment shown in FIGS. 1 and 2, a crystal pulling machine of the type which produces monocrystals by the Czochralski method is indicated in its entirety by the reference numeral 20. The crystal pulling machine 20 includes a growth chamber, generally indicated at 22, and an elongate pulling chamber, generally indicated at 24, above the growth chamber. A pull cable 26 extends from a crystal lifting mechanism, generally indicated at 28, which operates like a winch to selectively reel in and let out the pull cable. The crystal lifting mechanism 28 is enclosed by a housing 29 and the winch of the crystal lifting mechanism is coupled to the housing 29. The crystal lifting mechanism 28 is securely mounted on a plate 30 which is secured to the top of and rotates with a rotatable shaft 32 (or support). The shaft 32 is coupled to the pulling chamber 24 via suitable bearings 34 (FIG. 2) and may be rotated relative to the pulling chamber by a suitable motor (not shown) for rotation of the shaft, plate, and crystal lifting mechanism 28 about a generally vertical axis $Z_1$ (FIG. 1). In this embodiment, a high-integrity rotating vacuum seal 36 (FIG. 2) is between the shaft 32 and pulling chamber 24 for sealing against fluid leakage.

A crucible 38 in the growth chamber 22 containing molten crystal source material M (e.g., high-purity silicon) is held by a cup-shaped turntable 40 for rotation on a turntable shaft 42 extending from the turntable. A suitable motor (not shown) rotates the turntable shaft 42, turntable 40, and crucible 38 about an axis which is collinear with the vertical axis Z (i.e., the axis of rotation of the crystal lifting mechanism). During the crystal growing process, the turntable 40 and crucible 38 may be rotated in the opposite direction of (i.e., counter-rotated with) the shaft 32, plate 30, and crystal lifting mechanism 28.

During the crystal growing process, a seed crystal 44 (FIG. 1) is held at the lower end of the pull cable 26 via a seed chuck 46. The crucible 38 and pull cable 26 are counter-rotated and the seed crystal 44 is lowered into contact with the molten silicon in the crucible. When the seed crystal 44 begins to melt, it is slowly withdrawn from the molten silicon via the crystal lifting mechanism 28 and starts to grow, drawing silicon from the melt to form a crystal ingot 48.

A top portion of the pulling chamber 24 comprises a positioner housing 50 which houses a bushing generally indicated at 52 in FIG. 2. The bushing 52 is adapted for actively dampening pendular motion of the pull cable 26 during the crystal growing process. It includes an annular guide bushing 54 defining a central opening 56 for passage of the pull cable 26. The opening 56 in the guide bushing 54 is sized for a close sliding fit of the pull cable 26 through the opening and is sized for a maximum clearance of approximately 0.0005 inches. Because of the close fit, the pull cable 26 will move laterally with lateral movement of the guide bushing 54 and may be raised and lowered relative to the guide bushing. In some embodiments, the guide bushing 54 is made of polytetrafluoroethylene or other suitable material to minimize friction between the bushing and pull cable 26 as the pull cable is raised and lowered.

Figure 3:
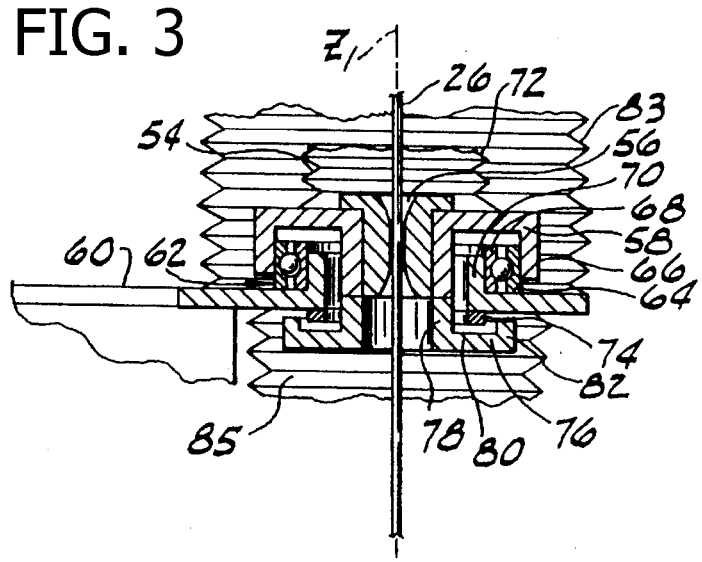
FIG. 3 is an enlarged view of a guide bushing, bushing carrier, and adjustable support plate of the bushing of FIG. 2.

The guide bushing 54 is secured to a bushing carrier 58 which is rotatably coupled to an adjustable support plate 60 by a bearing assembly generally indicated at 62 for rotation of the bushing and bushing carrier about an axis $Z_1$ (FIG. 3). The bearing assembly 62 has an outer race 64 secured to a downwardly projecting annular flange 66 of the bushing carrier 59 and an inner race 68 secured to an upwardly projecting annular flange 70 of the support plate 60. In some embodiments, the bearing assembly 62 is a high-precision bearing assembly for minimizing lateral movement (play) of the bushing 54 and bushing carrier 58 relative to the support plate 60. Thus, lateral movement of the support plate 60 causes lateral movement of the guide bushing 54.

The bushing carrier 58 is connected to the shaft 32 via a flexible shaft coupling 72 such as a bellows-type coupling sold under the trademark Servometer®. The shaft coupling 72 causes the bushing carrier 58 and guide bushing 54 to rotate with the shaft 32 while allowing lateral movement of the bushing carrier and bushing relative to the shaft.

A first annular seal member 74 (FIG. 3) is secured to the underside of the support plate 60 and a second seal member 76 is secured to the bushing carrier 58. The second seal member 76 has a cylindric portion 78 extending from the bushing carrier 58, an outwardly projecting annular flange 80 extending from the bottom of the cylindric portion and projecting under the first seal member 74, and an upstanding annular flange 82 at the outer periphery of the outwardly projecting annular flange and disposed generally circumferentially about the first seal member. The first and second seal members 74, 76 constitute a labyrinth seal for preventing silicon oxide from passing upward between the bushing carrier 58 and support plate and contaminating the bearing assembly 62. Upper and lower flexible bellows 83, 85, in some embodiments made of stainless steel, connect the support plate 60 to the positioner housing 50 for maintaining an evacuated chamber in the positioner housing while permitting lateral movement of the support plate relative to the positioner housing.

The support plate 60 is laterally moveable by first and second linear slide assemblies 84, 86, shown schematically in FIGS. 2 and 4. The slide assemblies 84, 86 constitute actuator mechanisms for adjusting the lateral position of the guide bushing 54. The first slide assembly 84 includes a base member 88 and a slider member 90 adapted for sliding on the base member rearwardly and forwardly along an axis Y (i.e., up and down as viewed in FIG. 4). The second slide assembly 86 includes a base member 92 and a slider member 94 adapted for sliding on the base member side-to-side along an axis X (i.e., right to left as viewed in FIGS. 2 and 4). In some embodiments, the slide assemblies 84, 86 are motor actuated slides powered by electric motors (not shown). An example of such a slide assembly is an Electro-Slide®, available from Micro Slides Inc., Westbury, N.Y. The base member 88 of the first slide assembly 84 is secured to the positioner housing 50.

The base member 92 of the second slide assembly 86 is secured to and moveable with the slider member 90 of the first slide assembly 84. The support plate 60 is secured to and moveable with the slider member 94 of the second slide assembly 86. Movement of the slider member 90 of the first slide assembly 84 along the axis Y causes linear movement of the support plate 60 and second slide assembly 86 in first (forward) and second (rearward) opposite directions (i.e., in and out of the page as viewed in FIG. 2, and up and down as viewed in FIG. 4). Movement of the slider member 94 of the second slide assembly 86 along the axis X causes linear movement of the support plate 60 in third and fourth opposite directions (i.e., from right to left as viewed in FIGS. 2 and 4). In some embodiments, the third and fourth directions are generally perpendicular to the first and second directions. Since the guide bushing 54 moves laterally with the support plate 60, movement of the slider members 90, 94 causes lateral movement of the guide bushing and pull cable 26.

The slide assemblies 84, 86 are one embodiment for adjusting the lateral position of the guide bushing 54, but it is to be understood that other mechanisms could be employed without departing from the scope of this disclosure. For example, the mechanisms could include solenoids, hydraulic cylinders, servomotor driven screw assemblies, or any other suitable mechanism for laterally moving the support plate 60.

Actuation of the slide assemblies is controlled by a suitable controller 96 (schematically shown in FIG. 2) based on the position of the pull cable 26 as sensed by first and second position sensors 101, 103 (FIGS. 2 and 5) extending downward from the underside of the positioner housing 50. The position sensors 101, 103 sense the lateral position of a portion 105 of the pull cable 26 located a set distance d (FIG. 2) below the elevation E of the guide bushing 54. In some embodiments, the distance d is at least approximately 5% of a distance D between the elevation E of the guide bushing 54 and the elevation E of the surface of the molten crystal source material M. For ease of understanding, x- and y-coordinate planes have been included in FIG. 5. The first position sensor 101 senses a y-coordinate value of the cable portion 105 (i.e., senses the distance of the cable portion from the x-coordinate plane) and the second position sensor 103 senses an x-coordinate value of the cable portion (i.e., senses the distance of the cable portion from the y-coordinate plane). The first position sensor 101 comprises a first light-emitting diode 107 and a first masked photodiode assembly 109. The second position sensor 103 comprises a second light-emitting diode 111 and a second masked photodiode assembly 113. For simplification, only the first position sensor 101 will be described in detail. However, it is to be understood that the second position sensor 103 operates in the same manner.

Referring now to FIG. 6, the first masked photodiode assembly 109 comprises upper and lower semicircular-shaped photodiodes 115, 117 masked at their outer peripheries by a suitable masking 119 to form corresponding upper and lower triangular-shaped unmasked portions 121, 123. Illumination of the unmasked portion of each photodiode generates an electric signal (e.g., an electric current or voltage). An increase in illumination increases the signal and a decrease in illumination decreases the signal. The first light-emitting diode 107 constitutes a collimated light source for illuminating the upper and lower unmasked portions 121, 123 of the photodiodes 115, 117. The first position sensor 101 is oriented so that the cable portion 105 is between the first light-emitting diode 107 and first photodiode assembly 109. In this arrangement, the cable portion 105 shades an area 125 of the upper unmasked portion 121 and an area 127 of the lower unmasked portion 123. The first light-emitting diode 107 uniformly illuminates unshaded areas 129, 131 of the upper unmasked portion 121 and unshaded areas 133, 134 of the lower unmasked portion 123. Movement of the pull cable 26 forward (i.e., toward the bottom of the page as viewed in FIG. 5) causes the shaded areas 125, 127 to move to the right in FIG. 6; movement of the pull cable forward (i.e., upward toward the top of the page as viewed in FIG. 5) causes the shaded areas to move to the left in FIG. 6.

The size of the shaded area 125 of the upper unmasked portion 121 increases as it moves rearward (to the left as viewed in FIG. 6) and decreases as it moves forward (to the right as viewed in FIG. 6). Since the area of the upper unmasked portion 121 is constant, the sum of the unshaded areas 129, 131 decreases as the shaded area moves rearward (left) and increases as the shaded area moves forward (right). Because the light energy illuminating the unshaded areas 129, 131 is uniformly distributed, the electric signal generated by the upper photodiode 115 increases as the shaded area 125 moves to the left and decreases as the shaded area moves to the right. Accordingly, the signal generated by the upper photodiode 115 is a function of the size of the unshaded area of the upper unmasked portion and therefore a function of the lateral position of the pull cable 26 (i.e., a function of the y-coordinate value of the cable portion 105). The y-coordinate value of the cable portion 105 can therefore be determined by the magnitude of the signal of the upper photodiode 115.

Although the y-coordinate value of the cable portion may be determined by the upper photodiode 115, use of the lower photodiode 117 in conjunction with the upper photodiode increases sensitivity. Because of the shape and orientation of the lower unmasked portion 123, the lower photodiode 117 operates 117 in an opposite manner as the upper photodiode 115. In particular, the sum of the unshaded areas 133, 134 of the lower photodiode 117 increases as the shaded area 127 moves to the left and decreases as the shaded area 127 moves to the right. Thus, the signal generated by the lower photodiode 117 increases as the shaded area 127 moves rearward (i.e., as the pull cable moves toward the top of the page as viewed in FIG. 5), and decreases as the shaded area moves forward. Sensitivity is increased by subtracting the signal generated by the lower photodiode 117 from the signal generated by the upper photodiode 115 to arrive at a signal remainder (hereinafter, position signal). The position signal from the first photodiode assembly 109 will have a zero value when the shaded areas 125, 127 are centered as shown in FIG. 6, will have a positive value when the shaded areas move to the right and will have a negative value when the shaded areas move to the left.

The controller 96 is responsive to the position signal generated by the first photodiode assembly 109 for controlling the first slide assembly 84 as a function of the position of the pull cable 26 to dampen pendular motion in the first and second directions. As discussed below, the controller 96 is also responsive to the position signal generated by the second photodiode assembly 113 for controlling the second slide assembly 86 as a function of the position of the pull cable 26 to dampen pendular motion in the third and fourth directions. The controller 96 may comprise one or more processors for controlling the slide assemblies.

Pendular motion of the pull cable 26 is sensed by the first photodiode assembly 109 which generates a generally periodic (e.g., sinusoidal) position signal in response thereto. Based on the position signal, the controller 96 can determine the pendular frequency and position of the portion 105 of the pull cable 26 relative to the bushing 54. The controller 96 may include suitable logic for filtering high frequencies (e.g., frequencies greater than 1 Hz) from the position signal so that the position signal is representative only of pendular motion of the pull cable 26. In response to the position signal, the controller 96 energizes the first slide assembly 84 to control the position of the guide bushing 54. Additional position sensors (not shown), such as shaft encoders on the shafts of the slide motors or any other suitable sensors, may be employed for sensing the position of the slide assemblies or guide bushing. In some embodiments, the first slide assembly 84 is controlled by the controller 96 to move the guide bushing 54 in a periodic motion having the same frequency as the position signal but lagging the position signal by approximately ¼ cycle. Also in some embodiments, the first slide assembly 84 moves the guide bushing 54 with an amplitude substantially less than the amplitude of motion sensed by the first photodiode assembly 109 to thereby provide an under damped system.

FIG. 7 is a representative graph showing: (1) motion of the pull cable 26 (as sensed by the first photodiode assembly 109) as the pull cable is dampened by motion of the bushing; and (2) dampening motion of the guide bushing 54 as controlled by the controller 96. The solid line 137 represents motion of the pull cable 26 and the dashed line 138 represents motion of the guide bushing 54. As shown in the graph, the controller 96 causes the guide bushing 54 to move with the same frequency as the pull cable 26, but ¼ cycle out of phase with (and lagging) the pull cable. The controller 96 also controls the first slide assembly 84 to decrease the magnitude of motion of the guide bushing 54 as the magnitude of motion of the pull cable 26 decreases. In some embodiments, the guide bushing 54 is displaced by the first slide assembly 84 a set fraction (e.g. 10%) of the sensed position of the pull cable 26. If a greater dampening rate is desired, the fraction can be increased; if a lesser dampening rate is desired, the fraction can be decreased. Thus, the controller 96 controls the first slide assembly 84 to dampen a component (e.g., y-coordinate component) of pendular motion of the pull cable 26. In other words, the first slide assembly 84 dampens pendular motion in the first and second directions.

The second photodiode assembly 113 detects motion of the pull cable 26 in the third and fourth directions (i.e., detects an x-coordinate component of the pendular motion) and generates a position signal representative of such motion. In response to such signal, the controller 96 controls the second slide assembly 86 to move the guide bushing 54 in the third and fourth directions (i.e., side-to-side) to dampen motion of the pull cable 26 in the third and fourth directions. It is to be understood that the second position sensor 103, controller 96, and second slide assembly 86 combine to dampen motion of the pull cable 26 in the third and fourth directions in substantially the same way the first position sensor 101, controller, and first slide assembly 84 dampens motion in the first and second directions. For sake of brevity therefore, application of these components to dampen motion in the third and fourth directions will not be discussed in greater detail.

In operation, the pull cable 26 may orbit the axis of rotation $Z_1$ or exhibit some other pendular motion during formation of the crystal ingot 48. The first position sensor 101 detects y-coordinate motion of the cable portion spaced the distance d (e.g., eight inches) below the guide bushing 54 and generates a position signal representative of the y-coordinate motion. Simultaneously therewith, the second position sensor 103 detects x-coordinate motion of the cable portion and generates a position signal representative of the x-coordinate motion. In response to the position signal generated by the first position sensor 101, the controller 96 causes the slider member of the first slide assembly 84 to slide on its corresponding base member along the Y-axis (FIG. 4) to move the guide bushing 54 and pull cable 26 therewith and thereby dampen y-coordinate pendular motion of the pull cable 26. In response to the position signal generated by the second position sensor 103, the controller 96 causes the slider member of the second slide assembly 86 to slide on its corresponding base member along the X-axis to move the guide bushing 54 and pull cable 26 therewith and thereby dampen x-coordinate pendular motion of the pull cable 26. In this manner, pendular motion of the pull cable 26 is actively dampened during the entire production phase of the crystal ingot.

Although the photodiode assemblies are in this embodiment analog-type photodiodes, it is to be understood that digital-type photodiodes (e.g., an array of photodiodes) could be used without departing from the scope of this invention. It is also to be understood that the positioning sensors could be replaced by any other suitable positioning sensor without departing from the scope of this disclosure.

Figure 8:
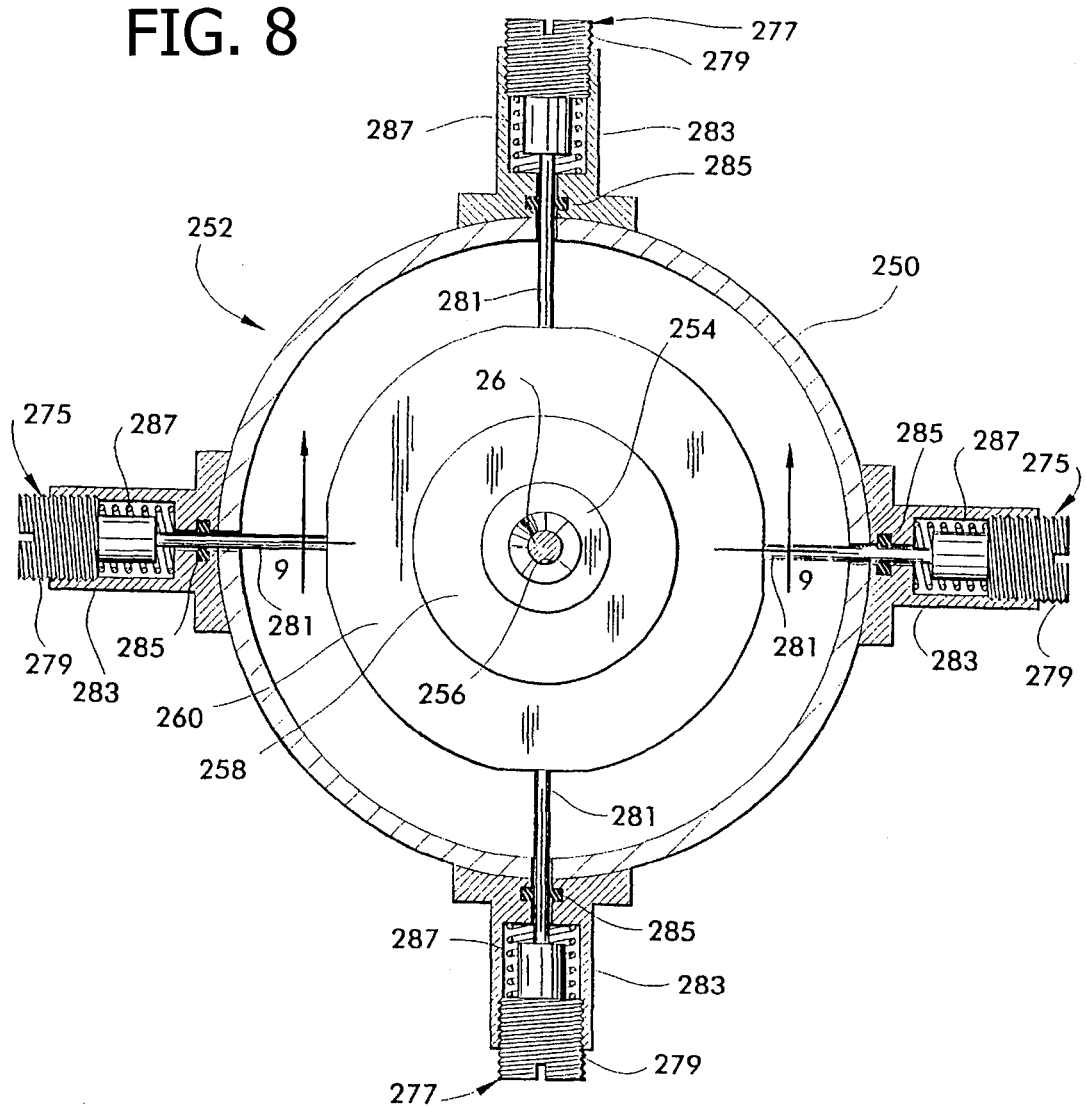
FIG. 8 is a section view similar to FIG. 4 of a second embodiment of a bushing.
Figure 9:
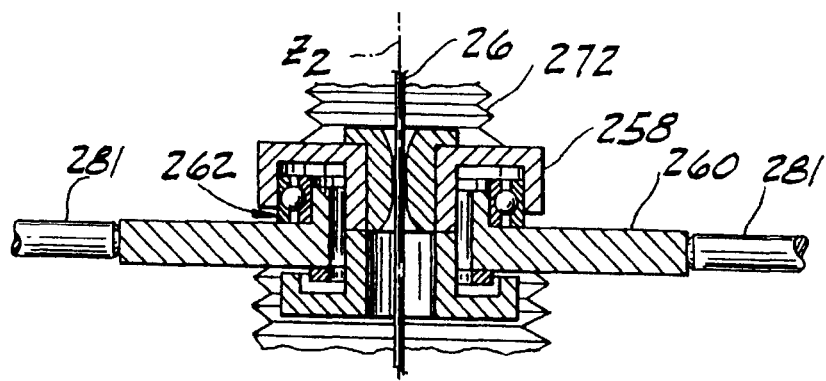
FIG. 9 is a cross-section view taken along the plane of line 9-9 of FIG. 8.

Another embodiment of a bushing of the present disclosure is indicated generally at 252 in FIGS. 8 and 9. The bushing 252 is similar to bushing 52 except it is adapted for adjusting the position of the cable only before a crystal growing process and not during such process. Thus, the bushing 252 does not actively dampen pendular motion. For convenience, corresponding parts are numbered the same as those parts shown in FIGS. 2-4 except the prefix "2" has been added to the reference numbers.

The bushing 252 includes an annular guide bushing 254 defining a central opening 256 for passage of the pull cable 26. The pull cable 26 will move laterally with lateral movement of the guide bushing 254 and may be raised and lowered relative to the guide bushing. The guide bushing 254 is secured to a bushing carrier 258 which is rotatably coupled to an adjustable support plate 260 by a bearing assembly generally indicated at 262 for rotation of the bushing and bushing carrier about an axis $Z_2$ (FIG. 9). A flexible shaft coupling 272 connects the bushing carrier 258 to the rotatable shaft (not shown). The shaft coupling 272 causes the bushing carrier 258 and guide bushing 254 to rotate with the shaft while allowing lateral movement of the bushing carrier and bushing relative to the shaft.

The support plate 260 is adjustably coupled to the positioner housing 250 via first and second pairs of adjustment screws 275, 277. Each adjustment screw has a threaded body 279 and an elongate stem 281 projecting radially inwardly from the threaded body. The threaded body 279 of each adjustment screw is threaded into a corresponding threaded socket 283 of the positioner housing 250. The elongate stem 281 of each adjustment screw extends into the positioner housing 250 and abuts the periphery of the support plate. In some embodiments, O-ring seals 285 are disposed circumferentially about the stems 281 of the adjustment screws to prevent fluid leakage into or out of the pull chamber. Also in some embodiments, compression springs 287 are within the sockets 283 for eliminating play between the threads of the screws and the threads of the sockets. Turning the first pair of adjustment screws 275 in their corresponding sockets 283 linearly moves the support plate 260 side-to side (i.e., to the left or to the right as viewed in FIG. 8). Turning the second pair of adjustment screws 277 in their corresponding sockets 283 linearly moves the support plate 260 rearward or forward (i.e., upward toward the top of the page or downward toward the bottom of the page as viewed in FIG. 8). Since the guide bushing 254 and bushing carrier 258 move laterally with the support plate 260, movement of the support plate laterally adjusts the position of the axis $Z_2$ (i.e., the axis of rotation of the guide bushing 254) relative to the axis $Z_1$ (i.e., the axis of rotation of the crystal lifting mechanism). In some embodiments, the position of the axis $Z_2$ (FIG. 9) is adjusted to align with the axis $Z_1$ and thereby eliminate any eccentricity of the pull cable centerline with respect to the axis of rotation of the crystal lifting mechanism.

Although adjustment screws are described as being the preferred mechanism of adjusting the lateral position of the support plate 260 bushing 252, it is to be understood that any suitable adjustment mechanism could be employed without departing from the scope of this disclosure.

Figure 10:
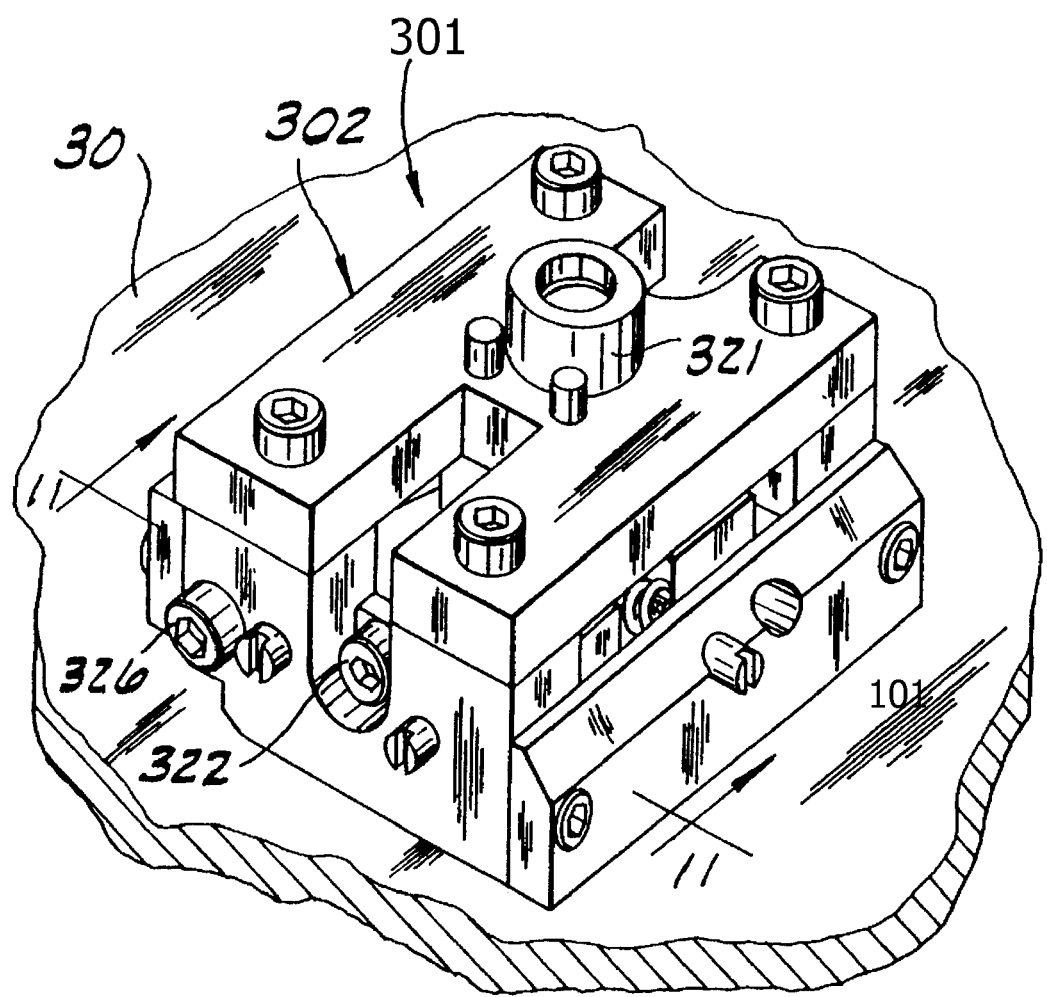
FIG. 10 is a perspective view of a third embodiment of a bushing.
Figure 11:
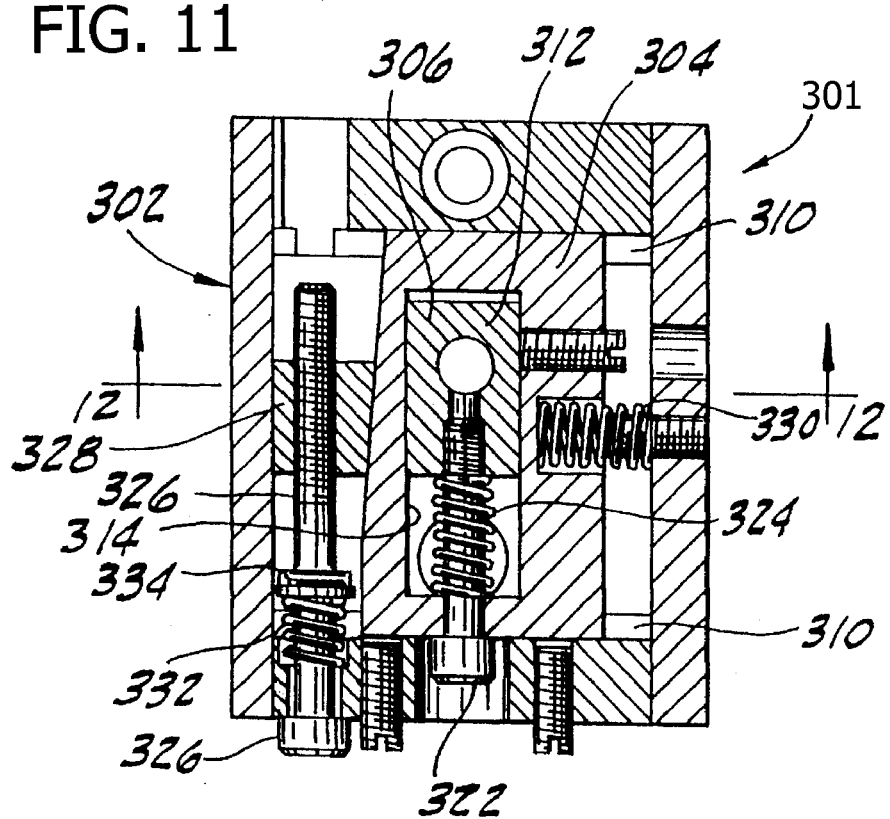
FIG. 11 is a cross-section view taken along the plane of line 11-11 of FIG. 10.
Figure 12:
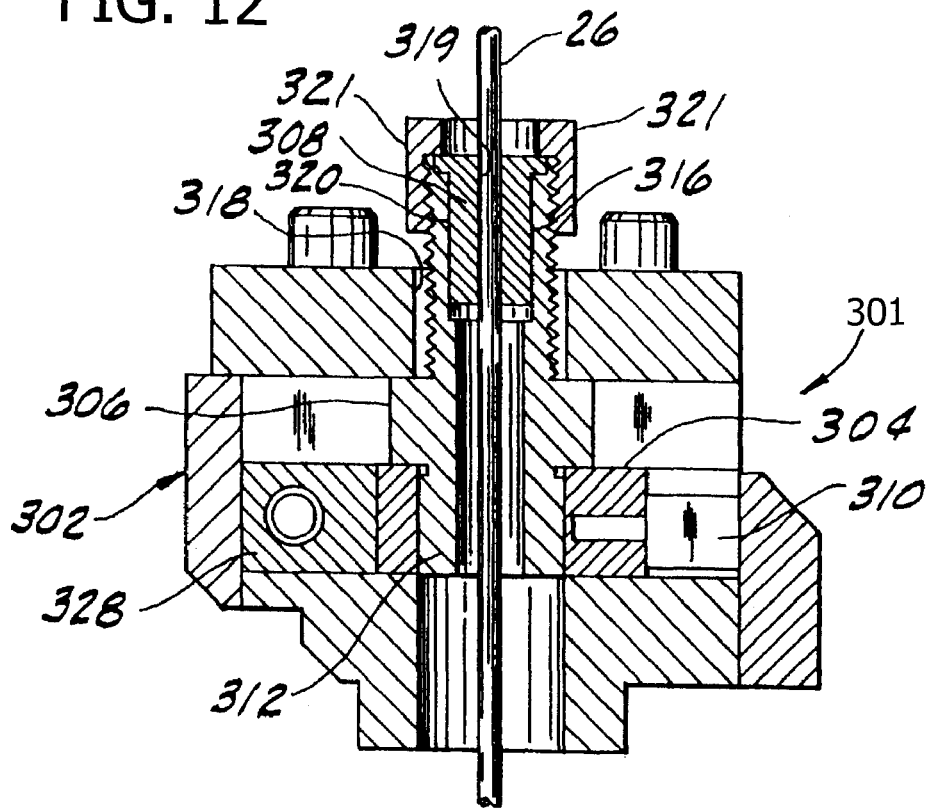
FIG. 12 is a cross-section view taken along the plane of line 12-12 of FIG. 11.

Referring now to FIGS. 10-12, a third embodiment of a bushing of the present disclosure is indicated generally at 301. Like bushing 252 of FIGS. 8 and 9, bushing 301 is adapted for adjusting the position of the pull cable only before a crystal growing process and does not actively dampen pendular motion. Unlike positioning apparatus 252, however, positioning apparatus 301 is secured to and rotates with the plate 30 to which the crystal lifting mechanism is attached.

The positioning apparatus 301 comprises a housing 302, a slider block 304, a bushing carrier 306, and a guide bushing 308. The housing 302 is securely fixed to the plate 30 via suitable fasteners (not shown). The slider block 304 is in the housing 302 and is sized and shaped for side-to-side sliding (right or left as viewed in FIG. 11) along channels 310 (FIG. 11) in the housing. The bushing carrier 306 has a downwardly projecting box-shaped portion 312 extending into a generally rectangular slot 314 in the slider block 304, and an upwardly projecting tubular portion 316 extending up through an opening 318 in the housing 302. The box-shaped portion 312 of the bushing carrier 306 is sized and shaped for forward and rearward sliding within the slot 314 (toward the top or bottom of the page as viewed in FIG. 11). The guide bushing 308 has a cylindric body 320 sized for a snug fit in an upper end of the tubular portion 316 of the bushing carrier 306. An opening 319 through guide bushing 308 is sized for passage therethrough of the pull cable 26. The guide bushing 308 is secured to the bushing carrier 306 by a threaded nut 321.

The shank of a first adjustment screw 322 extends through an opening in the slider block 304 and is threaded into the box-shaped portion 312 of the bushing carrier 306. A compression spring 324 within the slot 314 and surrounding the shank of the first adjustment screw 322 pushes against the box-shaped portion 312 of the bushing carrier 306 to bias the bushing carrier rearward (toward the top of the page as viewed in FIG. 11). Turning of the first adjustment screw 322 moves the bushing carrier and guide bushing 308 forward or rearward relative to the housing 302. The shank of a second adjustment screw 326 extends through an opening in the housing 302 and is threaded into a camming block 328. The camming block 328 has a sloped surface abutting a sloped surface of the slider block 304. A compression spring 330 biases the slider block 304 toward the left side of the housing 302 to keep the slider block in contact with the camming block 328. Another compression spring 332 surrounds the shank of the second adjustment screw 326 and engages the housing 302 and a circumferential flange 334 on the shank of the screw to bias the screw rearward relative to the housing. Turning the second adjustment screw causes forward or rearward movement of the camming block 328 which causes side-to-side movement of the slider block 304, bushing carrier 306, and guide bushing 308. Since the pull cable 26 moves laterally with the guide bushing 308, the lateral position of the pull cable can be adjusted by turning the first and second adjustment screws 322, 326. Thus, any eccentricities of the pull cable centerline with respect to the axis of rotation of the plate 30 and crystal lifting mechanism are eliminated or reduced.

Figure 13A:
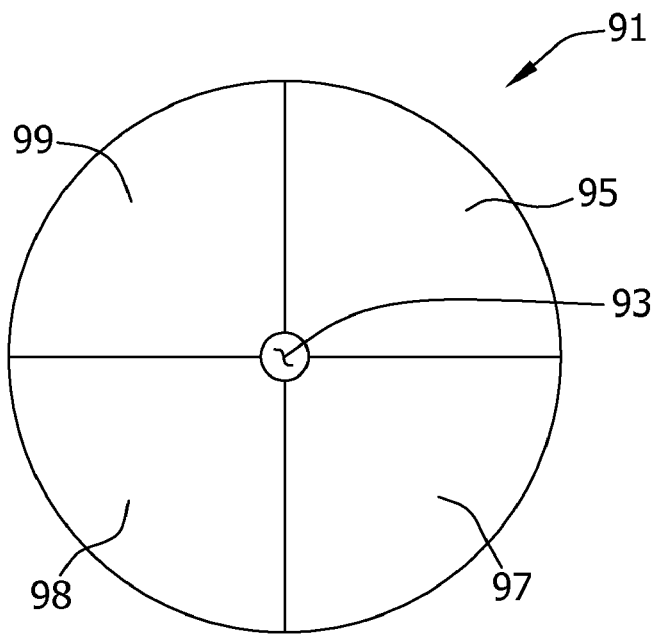
FIG. 13A is a partially schematic view of another embodiment of a bushing in a first position.
Figure 13B:
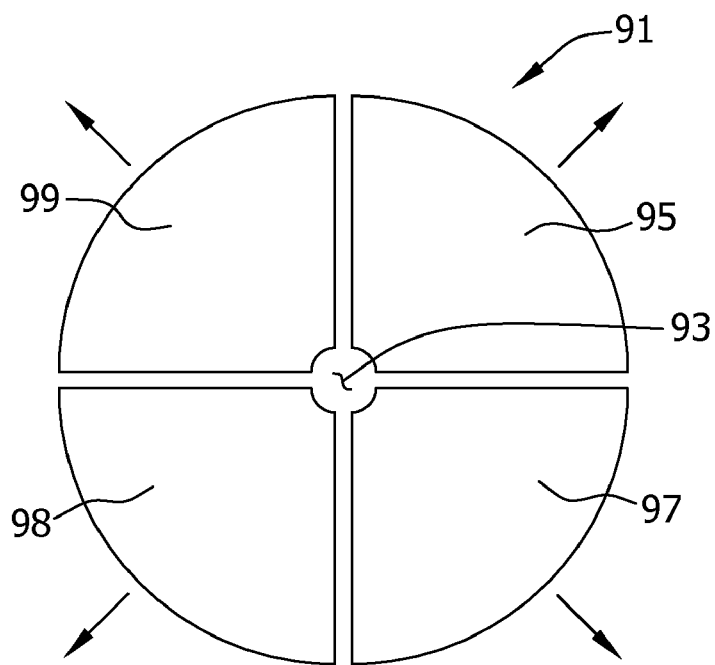
FIG. 13B is a partially schematic view of the bushing of FIG. 13A in a second position.

FIGS. 13A and 13B show partially schematic views of a bushing 91 similar to the guide bushing 54 described above in relation to FIGS. 1-12. The guide bushing 54 may be replaced with the bushing 91 without departing from the scope of the disclosure. The bushing 91 has four separate sections: a first section 95, a second section 97, a third section 98, and a fourth section 99. The bushing 91 may be comprised of more or fewer sections.

The bushing 91 is configurable between two positions. In a first position, as shown in FIG. 13A, the sections 95, 97, 98, and 99 are in contact with each other. In this position, bushing 91 has a central opening 93 that is sized such that the pull cable 26 contacts the bushing as it passes therethrough. This first position of the bushing 91 may be used in the embodiments described above in relation to FIGS. 1-12. In the second position of the bushing 91, as shown in FIG. 13B, the sections 95, 97, 98 and 99 are separated from each other such that a diameter of the central opening 93 is substantially greater than the diameter of the central opening in the first position. The pull cable 26 does not contact the central opening 93 of the bushing 91 as it passes therethrough when the bushing is in the second position. Thus, frictional forces are not imparted on the pull cable 26 by the bushing 91 when the bushing is in the second position. Any suitable mechanism may be used to translate the components 95, 97, 98, and 99 between the first position and the second position. For example, one or more linear actuators may be used to translate the sections 95, 97, 98, and 99 back and forth between the positions.

Generally, configuration of the bushing 91 in either the first position or second position depends on whether the elimination of pendular or orbital motion or the precise measurement of the weight of the silicon ingot is more important. If the elimination of pendular or orbital motion is more important, the bushing 91 is configured in the first position. However, if the precise measurement of the weight of the silicon ingot is more important then the bushing 91 is configured in the second position.

In some silicon crystal growth embodiments, the bushing 91 may be used in the first position (FIG. 13A) during the growth of the majority of the silicon ingot or the portion of the ingot that will be used to fabricate silicon wafers. Accordingly, the pendular or orbital motion of the silicon ingot is controlled while the portion of the ingot used to fabricate silicon wafers is being formed. The bushing 91 may then be translated to its second position during the growth of the end cone of the silicon ingot. Thus, the frictional forces are only imparted by the bushing 91 to the pull cable 26 during the formation of the majority of the ingot, and not during the growth of the end cone.

Figure 14:
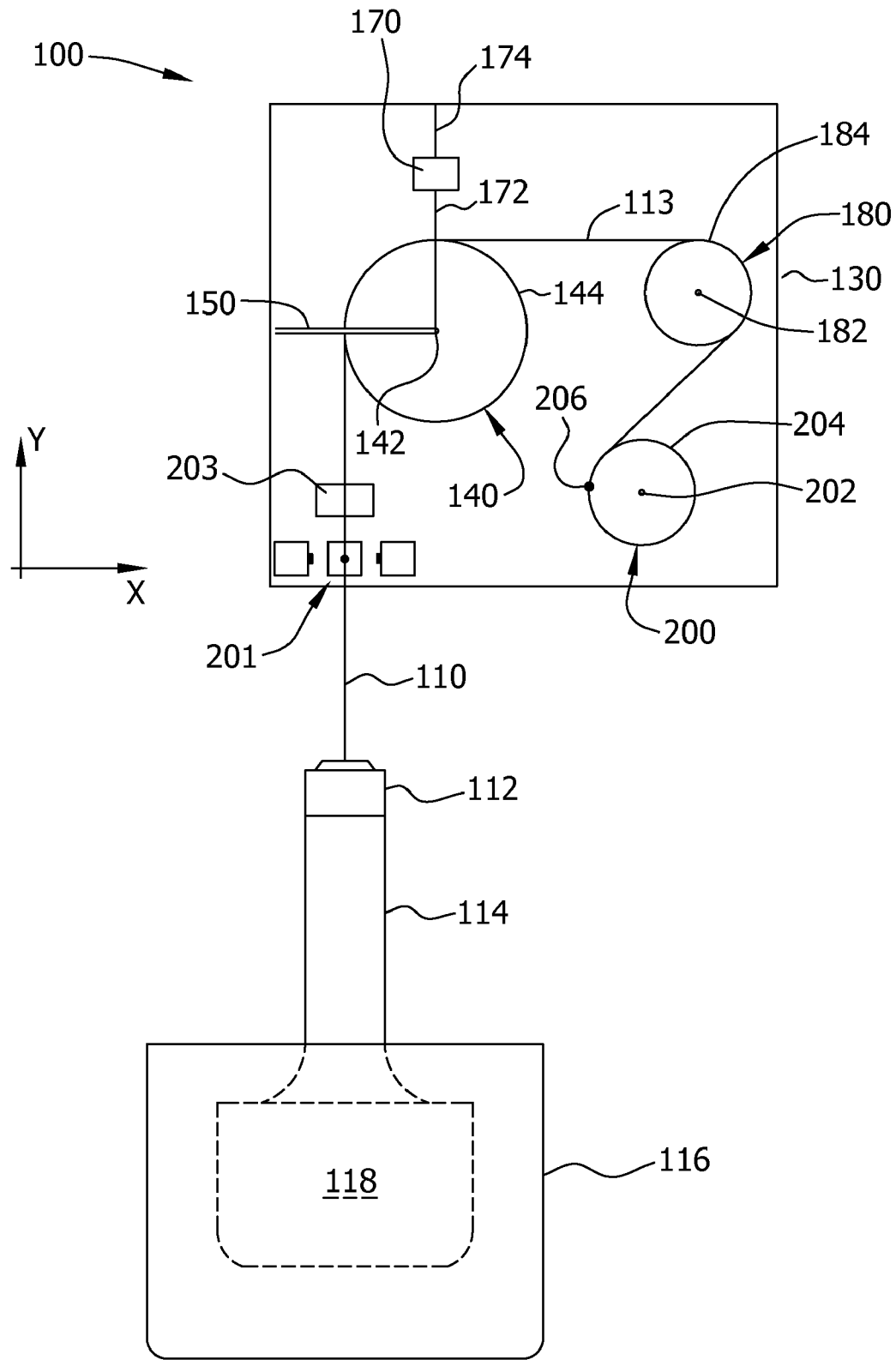
FIG. 14 is a partially schematic view of a crystal puller including a growing silicon ingot and a pulling system of one embodiment.

FIG. 14 shows an embodiment of a pulling apparatus (broadly, a "puller"), indicated generally at 100, for pulling an object attached to the end of a cable 110 (i.e., a pull cable) in the direction of the Y axis. In the embodiments of the disclosure described herein, specific reference is made to pulling systems used in conjunction with silicon ingot growth apparatuses, such as the crystal pulling machine 20 shown in FIG. 1. However, other embodiments of the disclosure may be used for purposes other than silicon ingot growth apparatuses. For example, the embodiments described herein may be used to determine the weight of any object suspended from a cable as it is pulled or to determine the amount of force required to pull an object across a surface as shown in FIG. 33.

The pulling apparatus 100 includes a frame 130 positioned within the housing 29 of FIG. 1. The frame 130 and the housing 29 are rotatable about an axis parallel to the Y axis and thus the frame can rotate as the object attached to the end of the cable 100 is pulled in the direction of the Y axis by the pulling apparatus 100.

In some embodiments, the frame 130 is not positioned within the housing 29 and the housing is not used. In these embodiments, the frame 130 is coupled to a support structure (not shown in FIG. 14) such as the plate 30 of FIG. 1 such that the frame is rotatable about an axis parallel to the Y axis. The frame 130 is a rigid structure and may be made of any suitable material (e.g., steel, aluminum, or alloys thereof). The high-integrity rotating vacuum seal 36 of FIG. 2 is used for sealing against fluid leakage between the pulling chamber 24 and the housing 29. In another embodiment, the vacuum seal 36 is not used and instead a separate vacuum enclosure (not shown) surrounds either the frame 130 or the housing 29 or both the frame and the housing 29 to maintain the vacuum integrity of the pulling apparatus 100. Moreover, the vacuum seal 36 permits the same pressure to be maintained within both the pulling chamber 24 and the housing 29.

The cable 110 is formed from any suitable material, including without limitation a steel or steel alloy. A chuck 112 is disposed at one end of the cable 110 in embodiments used in silicon crystal growth operations. The chuck 112 couples a seed crystal (not shown) to the cable 110. A growing silicon ingot 114 is grown from the seed crystal after the seed crystal is lowered into a crucible 116 of molten silicon 118. The chuck 112 thus couples the end of the cable to the growing silicon ingot 114. The cable 110 (and the chuck 112 and growing silicon ingot 114) are pulled upward by the pulling apparatus 100 as the silicon ingot grows.

A position sensor 201 is coupled to the frame 130 and is used to determine the position of the cable 110 with respect to the frame 130, and functions in the same or similar manner to the position sensors 101, 103 described above. In another embodiment, the position sensor 201 is coupled to a support structure separate from the frame 130 that remains fixed and stationary as the frame rotates. Position sensor 201 may contain a plurality of position sensing components. While a masked photo-diode sensor is described above in relation to position sensors 101, 103, any suitable measurement system may be used in position sensor 201, such as those employing lasers. Other measurement systems may be capacitance-based or electromagnetic systems using reflected radiation. A bushing 203 is disposed to at least partially surround the cable 110. In this embodiment, the bushing 203 is disposed in the frame 130, but may be disposed outside the frame. The bushing 203 and position sensor 201 function the same as or similarly to the bushing 52 described above, and are thus likewise capable of actively dampening pendular or orbital motion of the cable 110.

A pulley 140 (broadly, a first cylinder) is positioned within the frame 130. In other embodiments, the pulley 140 may be positioned outside of the frame 130. The pulley 140 is formed from any suitable material, including without limitation, steel or aluminum alloy. The pulley 140 has a center axis 142 about which it rotates. The center axis 142 is disposed at or near the geometric center of the pulley 140. Bushings, bearings or other suitable structures may be positioned adjacent to or around the center axis 142. An axle or pin may thus pass through the center axis 142 and contact the bushings or bearings, and not the pulley 140, thus reducing the amount of force required to rotate the pulley about the center axis.

The pulley 140 has a groove formed along its outer circumferential surface 144, according to some embodiments. The groove is comprised of a trough and a corresponding pair of vertical or tapered walls. The trough and vertical or tapered walls are appropriately sized to receive the cable therein while permitting some clearance between the cable and the groove (i.e., the distance between the vertical or tapered walls is greater than the diameter of the cable 110).

Figure 15:
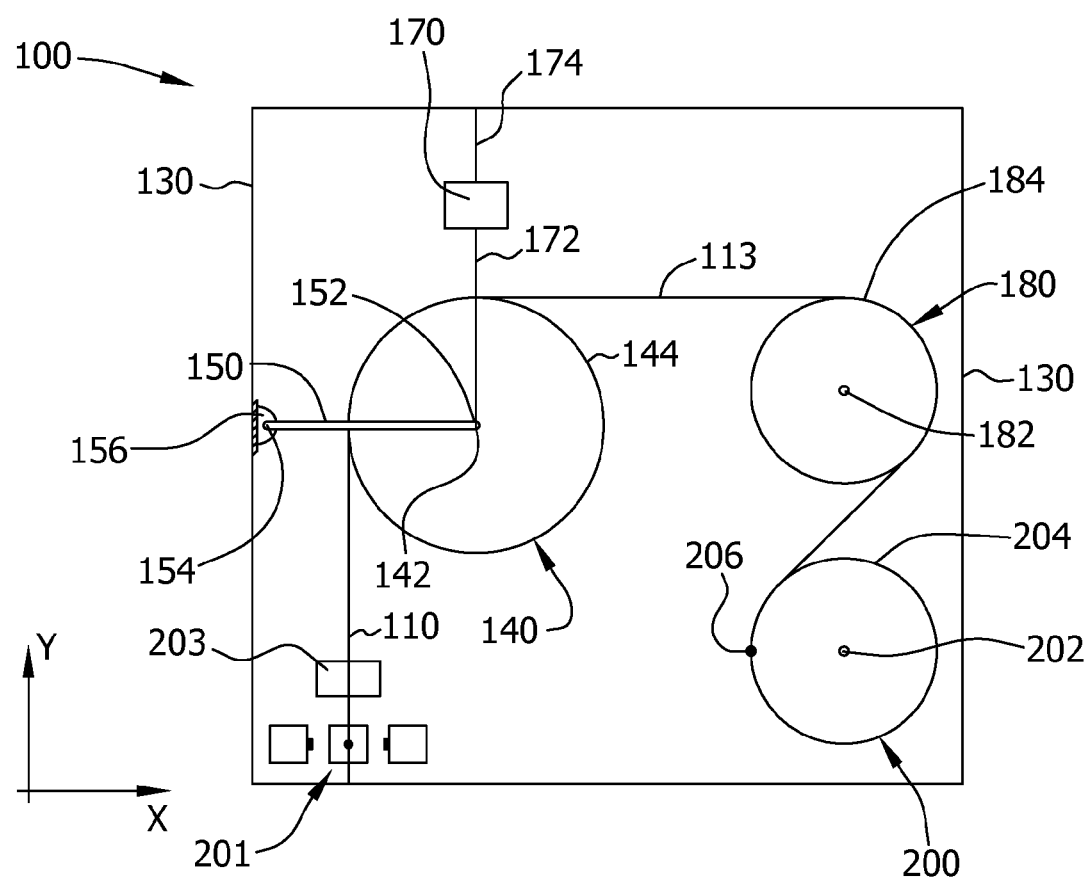
FIG. 15 is an enlarged view of a portion of FIG. 14.

As shown in FIG. 14 and more clearly seen in FIG. 15, an arm 150 is coupled at a first end 152 to the pulley 140 at the center axis 142. A second end 154 of the arm 150 is pivotably coupled to the frame 130 by a connector 156. The connector 156 is in turn rigidly coupled to the frame by any suitable connection mechanism, such as by welding or through the use of fasteners. A bearing or bushing may be used in the connector 156 to permit rotation of the arm 150 with respect to the frame 130. As used herein, the terms "coupled" and "connected" include direct connection or coupling between two or more elements, as well as indirect connection or coupling between two or more elements, e.g., where intervening elements connect or couple the elements together.

The arm 150 is allowed to rotate about the second end 154. The first end 152 is allowed to move generally in a direction parallel to the Y axis, while being constrained from moving in a direction parallel to the X axis. By extension, the pulley 140 coupled to the first end 152 of the arm is allowed to move in a direction parallel to the Y axis, while being constrained from movement parallel to the X axis. The arm 150 is constructed from any suitable material that is rigid and/or resistant to elongation in a direction substantially parallel to the X axis (e.g., steel and alloys thereof, aluminum, titanium, or other composite materials).

The pulley 140 of this embodiment is suspended from a load cell 170. The load cell 170 is coupled to the pulley 140 by a first connector 172 at the center axis 142 of the pulley 140. The first connector 172, according to some embodiments, is rigid and does not deflect or stretch under normal operating conditions. The first connector 172 may permit rotational movement between the load cell 170 and the first connector. As described above, an axle passes through the center axis 142 of the pulley 140 and couples the first connector 172 to the pulley. The axle may also pass through or be otherwise coupled to the arm 150 at or near the first end 152 of the arm.

The load cell 170 is coupled to the frame 130 by a second connector 174. Like the first connector 172, the second connector 174 is a rigid member which does not appreciably deflect under normal operating conditions and may permit rotational movement between the load cell 170 and the second connector. The second connector 174 may be coupled to the frame 130 by a pin or axle type coupling.

Load cell 170 may be any one of a variety of types of load cells, such as one of an electronic, hydraulic, or hydrostatic type. According to one embodiment, the load cell 170 is an electronic load cell and converts a force exerted on strain gauges into an electrical signal. The strain gauges, arranged for example in a Wheatstone bridge configuration, output electrical signals in proportion to the amount of deformation (i.e., strain) experienced by the strain gauge. The electrical signals are amplified and then analyzed by a processor (shown in FIG. 19). The processor applies an algorithm to the electrical signals to determine the amount of force correlating therewith. Further use of the determined amount of force is discussed below.

Referring to FIGS. 14 and 15, an idler pulley 180 (broadly, a second cylinder) is rotatably coupled to the frame 130 about a center axis 182. The idler pulley 180 is constrained from movement, other than rotation, by an axle passing through the center axis 182. The axle is attached to the frame 130 so that the idler pulley is secured to the frame 130. Like the pulley 140, a groove is formed in an outer circumferential surface 184 of the idler pulley. The groove is comprised of a trough and a pair of opposing vertical or tapered walls. The components of the groove are sized to receive the cable 110 with an adequate clearance between the cable and the groove. In the embodiments shown in FIGS. 16 and 17, the idler pulley 180 is not used. Instead, the cable 110 passes directly from the pulley 140 to the drum 200.

A terminal (i.e., second) end 206 of the cable 110 is coupled to an outer circumferential surface 204 of a drum 200. The drum 200 is in turn coupled to a drive (not shown). The drive is operable to rotate the drum 200 about a center axis 202 of the drum. The drive is an electric motor according to one embodiment. The outer circumferential surface 204 of the drum may have grooves formed therein for receiving the cable 110. The grooves may be in a helical arrangement such that successive windings of the cable do not overlap each other as the cable 110 is wound around the outer circumferential surface 204. The drum 200 and the accompanying drive are similar in operation to a winch, according to one embodiment. Included with the drive is a rotary encoder configured to measure the rotational displacement of the drive, and hence the rotary displacement of the drum 200 coupled thereto. In other embodiments, the drive is a stepper motor and hence the use of a rotary encoder may not be necessary to measure the displacement of the drum 200.

Figure 16:
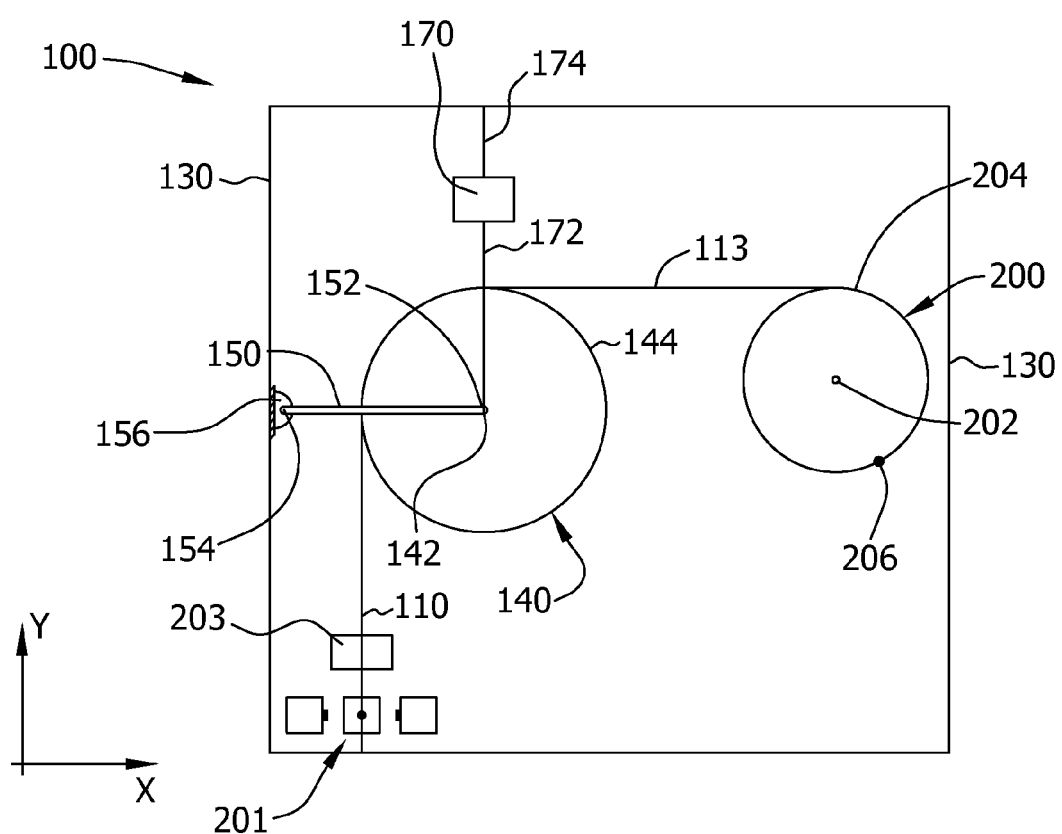
FIG. 16 is a view like FIG. 15 but showing another embodiment of a pulling system.
Figure 17:
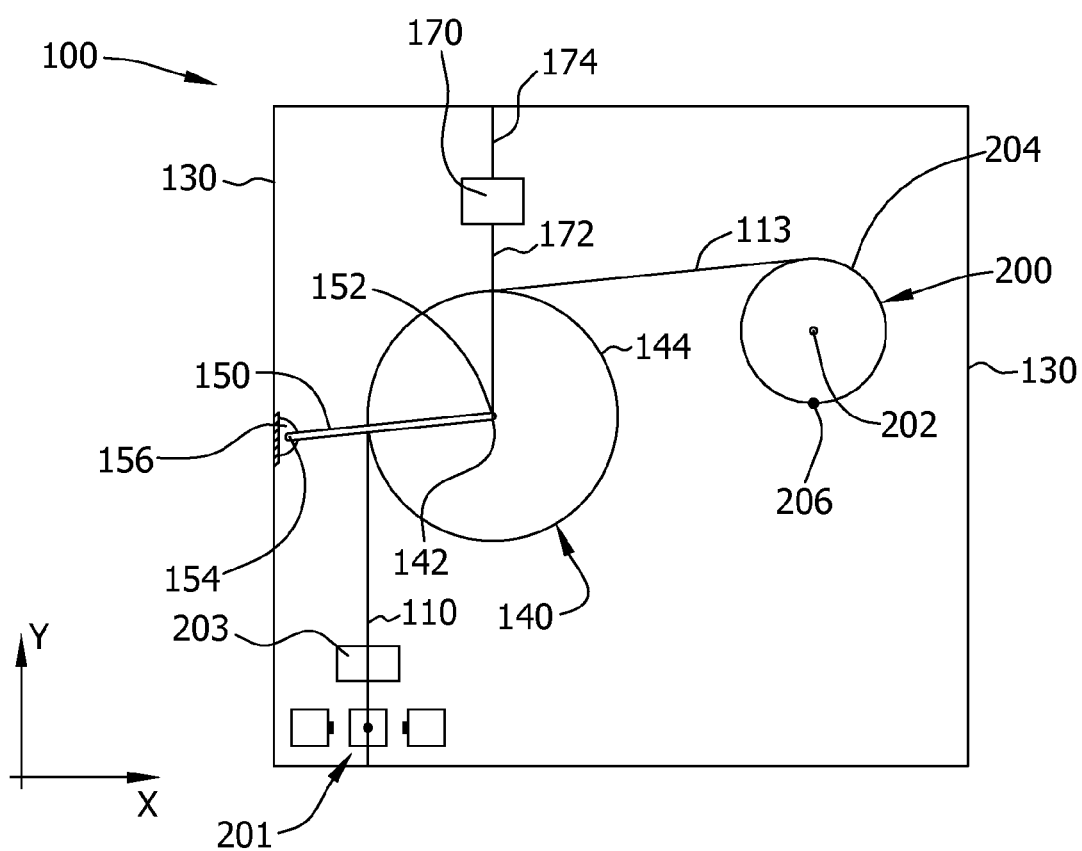
FIG. 17 is a view like FIG. 16 but showing still another embodiment.

As shown in FIGS. 14 and 15, a portion 113 of the cable 110 travels between the outer circumferential surface 144 of pulley 140 and the outer circumferential surface 184 of idler pulley 180 in a path parallel to both the X axis and the arm 150. In the embodiments of FIGS. 16 and 17, the portion 113 of the cable travels between the outer circumferential surface 144 of the pulley 140 and the outer circumferential surface of 204 of the drum 200. As shown in FIG. 17, the portion 113 of the cable 110 travels between the pulley 140 and drum 200 along a path which is not parallel to the X axis. Instead, the portion 113 of the cable 110 travels along a path that is parallel to the arm 150.

Figure 18A:
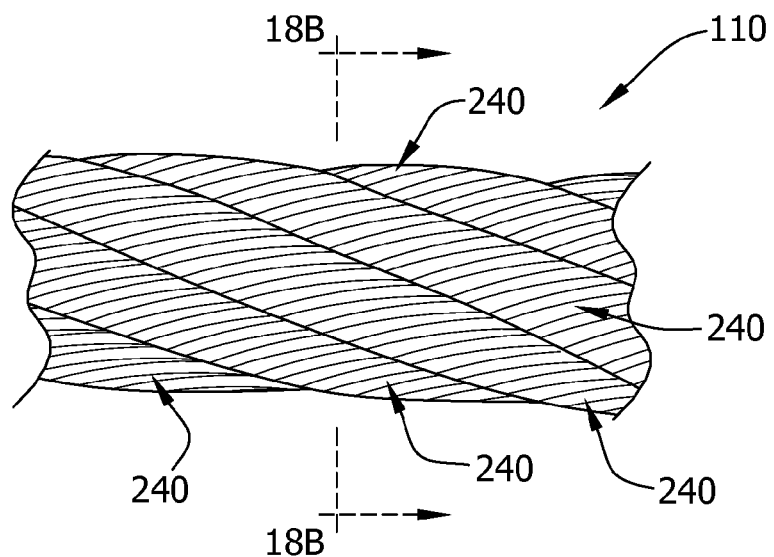
FIG. 18A is a side view of a portion of an example cable of the pulling system.
Figure 18B:
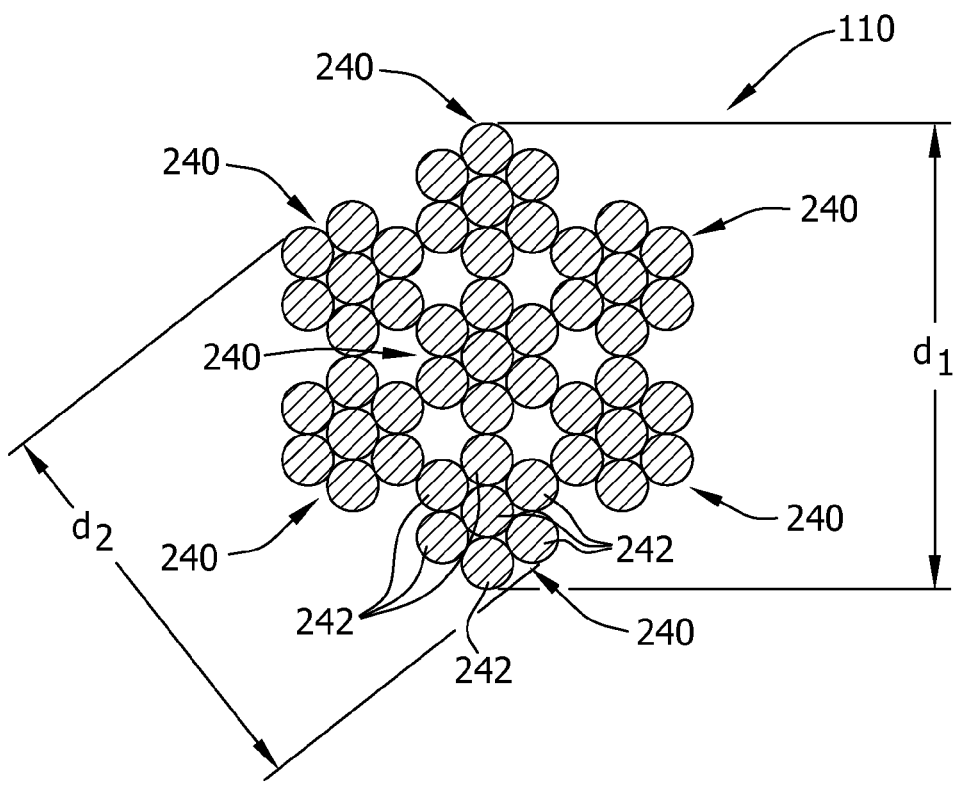
FIG. 18B is a cross-section view of FIG. 18A along the 18B-18B line.

FIG. 18A shows a side view of a portion of the cable 110 used in the pulling system 100. FIG. 18B is a cross-section view of FIG. 18A. The cable 110 of this embodiment is a wire rope formed from smaller wire ropes 240 which are twisted together to form the cable 110. Each of wire ropes 240 are formed from strands 242 of wire which are twisted together to form the respective wire ropes 240. The wire rope configuration shown in FIGS. 18A and 18B is a 7×7 arrangement. In this arrangement, the wire rope includes 7 small wire rope assemblies which are each in turn formed from sub-assemblies of 7 wires each. Different configurations of wire rope may be used according to other embodiments (the 7×7 arrangement is one of many suitable configurations). For example, other embodiments may use a single, unitary cable or wire formed from a continuous strand of material, instead of the cable 110 shown in FIGS. 18A and 18B.

As seen in FIG. 18B, the effective diameter of the cable 110 varies at different points along a cross-section of the cable. For example, the cable 110 has a maximum diameter $d_1$ and a minimum diameter $d_2$. As the cable passes over the pulley 140, idler pulley 180, or drum 200, the effective diameter of the cable 110 thus varies between the maximum diameter $d_1$ and the minimum diameter $d_2$ because of the helical configuration of the wire cable ropes 240 and strands 242. If the diameter of the cable 110 differs at the points where the cable 110 first comes into contact with the pulley 140 and where it first is out of contact with pulley 140, the tension in the portion 113 of the cable 110 will differ from the tension in the vertical portion of the cable 110 which is parallel to the Y axis in order to maintain a net torque of zero on the pulley 140. Also, if the diameter of the portion 113 of cable 110 differs at the points where it first comes out of contact with pulley 140 and where it first comes into contact with pulley 180 or drum 200, the portion 113 of cable 110 will no longer be parallel to arm 150.

Figure 19:
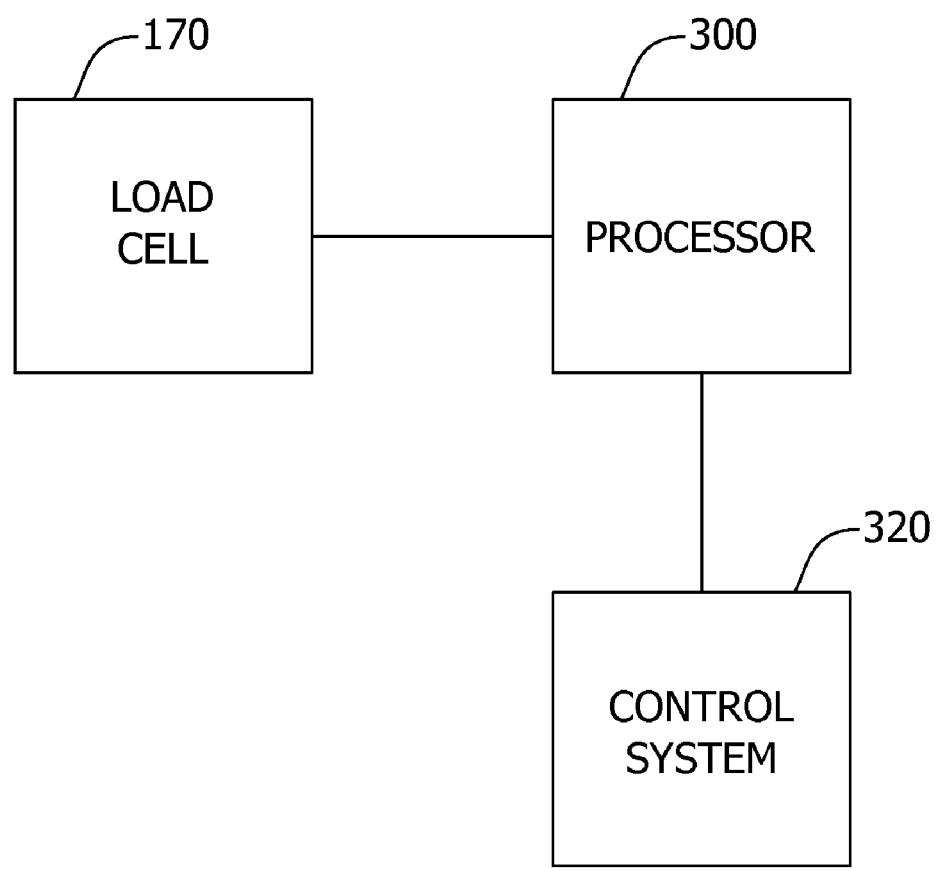
FIG. 19 is a schematic view of a load cell, processor, and control system.

FIG. 19 is a schematic representation of the load cell 170, a processor 300, and a control system 320. The load cell 170, processor 300, and control system 320 are communicatively coupled together. The processor 300 is a computer processor, and may include one or more forms of computer readable storage memory with computer executable instructions stored thereon. The control system 320, according to some embodiments, also includes computer processors and forms of computer readable storage memory with computer executable instructions stored thereon. The processor 300 and control system 320 include input/output components (not shown) for communicating with the load cell 170 and each other. The load cell 170 likewise includes an input/output component (not shown) for communicating with the processor 300 and control system 320. According to some embodiments, the functions of the processor 300 and control system 320 are performed by a single, multi-purpose component. In other embodiments, the processor 300 may be a part of the load cell 170.

The amount of force determined by the processor 300 and the load cell 170 is used to determine the weight of the object attached to the end of the cable (e.g., the growing silicon ingot 114). As the load cell 170 measures the amount of force exerted thereon by the pulley 140 and the cable 110, the force of gravity exerted on the object attached to the end of the cable is reflected in the force exerted on the load cell. The processor 300 uses the determined force and a known factor to determine the weight of the object. The known factor may reflect the mechanical advantage resultant from the arrangement of the pulley 140, the cable 110, and/or the drum 200. The mechanical advantage is defined as the ratio of the determined force on the load cell to the weight of the object. For example, if the arrangement of the pulley 140, cable 110, and/or drum 200 results in a mechanical advantage of two, the weight of the object coupled to the end of the cable is the determined force divided by the known factor (i.e., two). The known factor may also reflect systematic or regularly occurring errors in the pulling system 100. For example, if the determined force is actually 10% less than the true force exerted on the load cell 170, the known factor is equal to 0.9 if the mechanical advantage is equal to one. More generally, the overall known factor is equal to the mechanical advantage multiplied by systematic error (0.9 in the above example). Accordingly, the known factor and the force exerted on the load cell 170 by the pulley 140 and the cable 110 reflect the tension in the cable.

In some embodiments, such as those shown in FIG. 33, the pulling apparatus 100 (broadly, a "puller") is used to pull an object 151 attached to the cable 110 in a direction other than vertical. In the embodiment of FIG. 33, the pulling apparatus 100 is used to pull the object 151 over a horizontal surface 153, but in other embodiments the surface may be sloped. In the embodiments of FIG. 33, the arm 150 is positioned such that the portion 113 of cable 110 is still parallel to the arm. In still other embodiments, the arm 150 may be positioned such that it is perpendicular to the horizontal or sloped surface 153. The force exerted on the load cell 170 by the pulley 140 and cable 100 thus reflects the amount of force required to pull the object 151 across the surface 153. This force may reflect the coefficient of friction between the object 151 and the surface 153 and the normal force acting upon the object. The pulling apparatus 100 is thus able to determine the presence and relative degree of any change in the coefficient of friction between the object 151 and the surface 153 as the object is pulled thereon. The processor 300 may use the determined force and a known factor to determine the force required to pull the object 151 along the surface 153. The known factor may reflect the mechanical advantage resultant from the arrangement of the pulley 140, the cable 110, and/or the drum 200. The known factor may also reflect systematic or regularly occurring errors in the pulling system 100.

As discussed above, previous systems for measuring the weight of an object suspended from a cable routed over a pulley often yield unsatisfactory results. A number of sources of error contribute to the unsatisfactory results. Variations in the diameter of the cable 110 where it contacts pulley 140 affect the tension in the portion 113 of the cable 110. If the tension in portion 113 has a component parallel to the Y axis, that component of force will contribute to the force in the Y direction exerted on the pulley by the cable and detected by the load cell 170. Errors in the tension in portion 113 will therefore give rise to errors in the component of force detected by the load cell 170. If the tension in portion 113 of the cable 110 has a component parallel to the X axis, that component of force will generally not be detected by the load cell 170 in the embodiments shown in FIGS. 14, 15, and 16, so errors in the horizontal component of force will not be detected by the load cell 170. In the embodiment shown in FIG. 17, the horizontal component of the tension in portion 113 of cable 110 will not be detected by load cell 170 if portion 113 of cable 110 is parallel to arm 150, so errors in the tension will not be detected by load cell 170. Errors in both components of force are introduced by a number of factors, such as misalignment of the components of the pulling system 100 or the varying effective diameter of the cable 110.

The arm 150 restrains the pulley 140 from horizontal movement parallel to the X axis, and thus transfers the horizontal component of the force to the frame 130. Moreover, the cable 110 travels along a path that is substantially parallel to the arm 150 after being routed over the outer circumferential surface 144 of the pulley 140 and before contacting the outer circumferential surface of either the idler pulley 180 or drum 200. The error introduced by the horizontal component is thus rendered orthogonal to the vertical component of the force. Accordingly, the degree to which the horizontal component affects the vertical component of the force is effectively eliminated or significantly reduced. Moreover, the path traveled by a portion 113 of the cable 110 between the pulley 140 and drum 200 (or idler pulley 180) may not be parallel to the X axis, as in FIG. 17, and still be within the scope of the embodiments. As shown in FIG. 17, the path traveled by the portion 113 of the cable 110 is parallel to the arm 150, thus permitting the transfer of the horizontal component of the force (i.e., the tension in the cable) to the frame 130 even though the path is not parallel to the X axis. The weight measurements performed by the embodiments disclosed herein may be about 10 to 20 times more accurate when compared to those of previous systems. For example, previous systems may yield weight measurement errors of about 0.6 kg, while the embodiments disclosed herein may only have errors of about 0.04 kg.

FIGS. 20-28 show additional embodiments of pulling systems (broadly, "pullers") for pulling objects. The pulling systems of FIGS. 20-28 differ from those described above in that the cable 110 is substantially static with respect to the load cell pulley 140 while the object is weighed. The load cell pulley 140 is raised to pull the object upward while the weight of the object is measured by the load cell 170. Accordingly, sources of error introduced by the varying diameter of the cable 110 as it passes over the outer circumferential surface 144 of the load cell pulley 140 are effectively eliminated. The pulling systems of FIGS. 20-28 are equally well-suited for use in silicon crystal growth operations. Moreover, each of the pulling systems in FIGS. 20-28 use the bushing 203 and position sensor 201 to actively dampen pendular or orbital motion of the cable 110.

Figure 20:
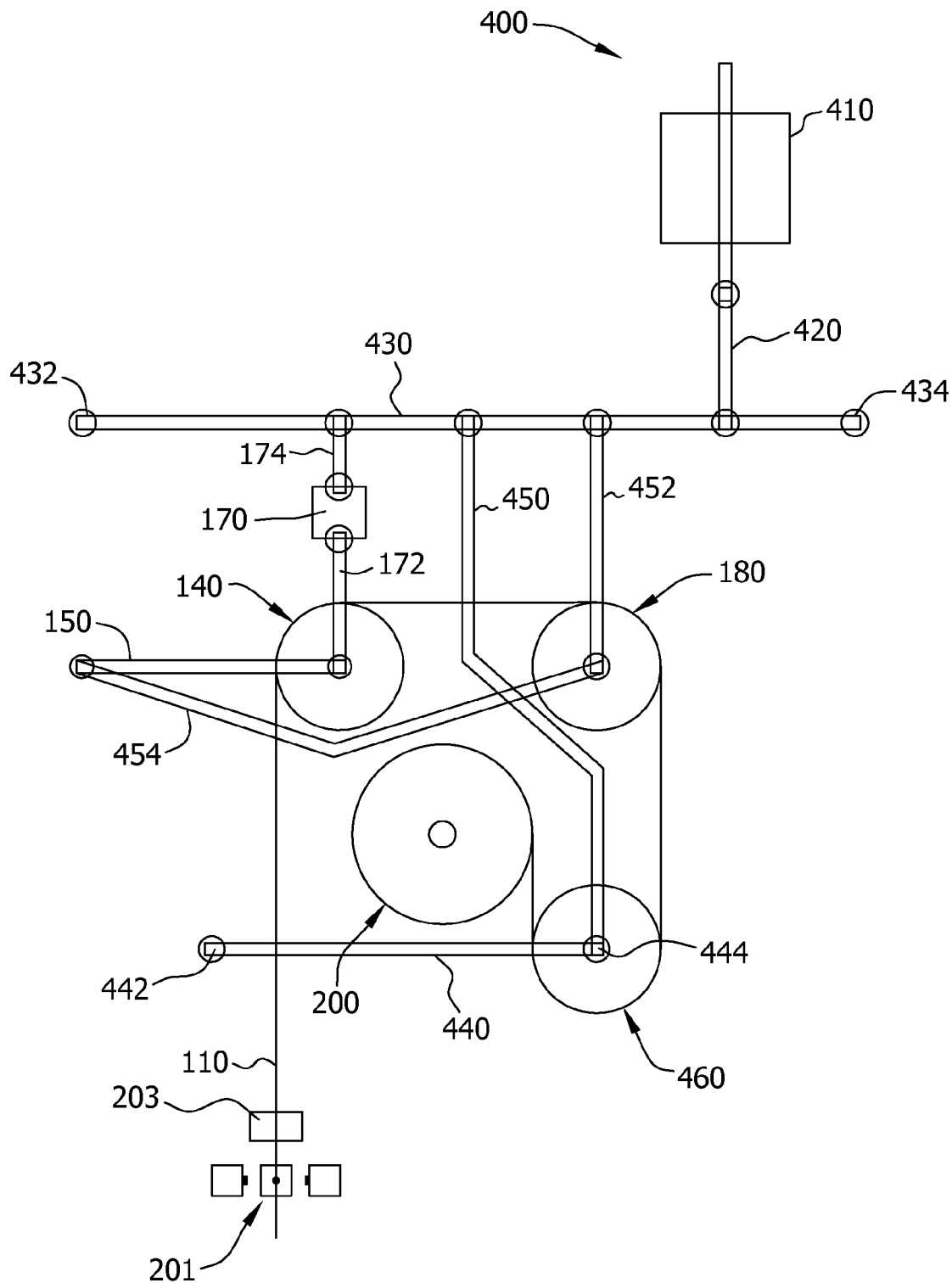
FIG. 20 is a side view of another embodiment of a pulling system.

FIG. 20 shows a first configuration of pulling system 400 in an initial position. Pulling system 400 includes a frame (not shown) with an actuator 410 coupled thereto. The actuator 410 is any suitable actuator capable of moving an actuator link 420 coupled thereto between a raised and lowered position. For example, actuator 410 may be a linear actuator, a rotary drive source used in conjunction with a cam and follower, or a rotary drive source with the link 420 coupled thereto.

The actuator link 420 is coupled to an upper arm 430. The upper arm 430 is rigid and pivotably coupled at a first end 432 to the frame 130. In the embodiment of FIG. 20, a second end 434 is not connected to any other components of the pulling system 400. A lower arm 440 is pivotably coupled to the frame at a first end 442 and rotatably coupled to an additional pulley 460 at a second end 444. The additional pulley 460 is similar in function to the idler pulley 180.

Like the pulling system 100 described above, the arm 150 is pivotably coupled to the frame at one end, and rotatably coupled to the load cell pulley 140 at its other, opposite end. Links 450, 452, 454 are rigid members which pivotably couple the other pulleys (i.e., idler pulley 180, and additional pulley 460) to either the frame and/or the upper arm 430.

The load cell 170 is pivotably coupled to the load cell pulley 140 at its center axis by the first connector. The load cell 170 is pivotably coupled to the upper arm 430 by the second connector 174. The drum 200 is coupled to the frame, as in pulling system 100.

Displacement of the actuator link 420 by the actuator 410 results in corresponding displacement of the upper arm 430. The upper 430 arm pivots about the first end 432 in response to the displacement of the actuator link 420, as the first end is pivotably coupled to the frame. The displacement of the upper arm 430 results in a corresponding displacement of the links 450, 452 and second connector 174 coupled thereto, which in turn causes displacement of the load cell 170 and pulleys 140, 180, and 460.

The pulling system in FIG. 20 is configured to permit the drum 200 to rotate at a substantially constant rate and raise the cable 110 at a rate suitable for use in silicon crystal growth embodiments. The lengths of the upper arm 430, links 450, 452 and connectors 172, 174 may be configured to maintain a substantially constant length of the cable 110 between the drum 200 and the load cell pulley 140 as the upper arm 430 are displaced. Thus, the vertical motion of the pulleys 140, 180, 460, upper arm 430, links 450, 452, 454, and connectors 172, 174 may be made independent of the rotational motion of the drum 200, thus enabling the cable 110 to remain static with respect to the load cell pulley 140 during weighing of the object provided that the actuator 410 displaces the actuator link 420 at an appropriate rate. The cable 110 thus remains static with respect to the load cell pulley 140 during weighing of the ingot so that variations in the diameter of the cable do not introduce errors into the force measured by the load cell 170.

Figure 21:
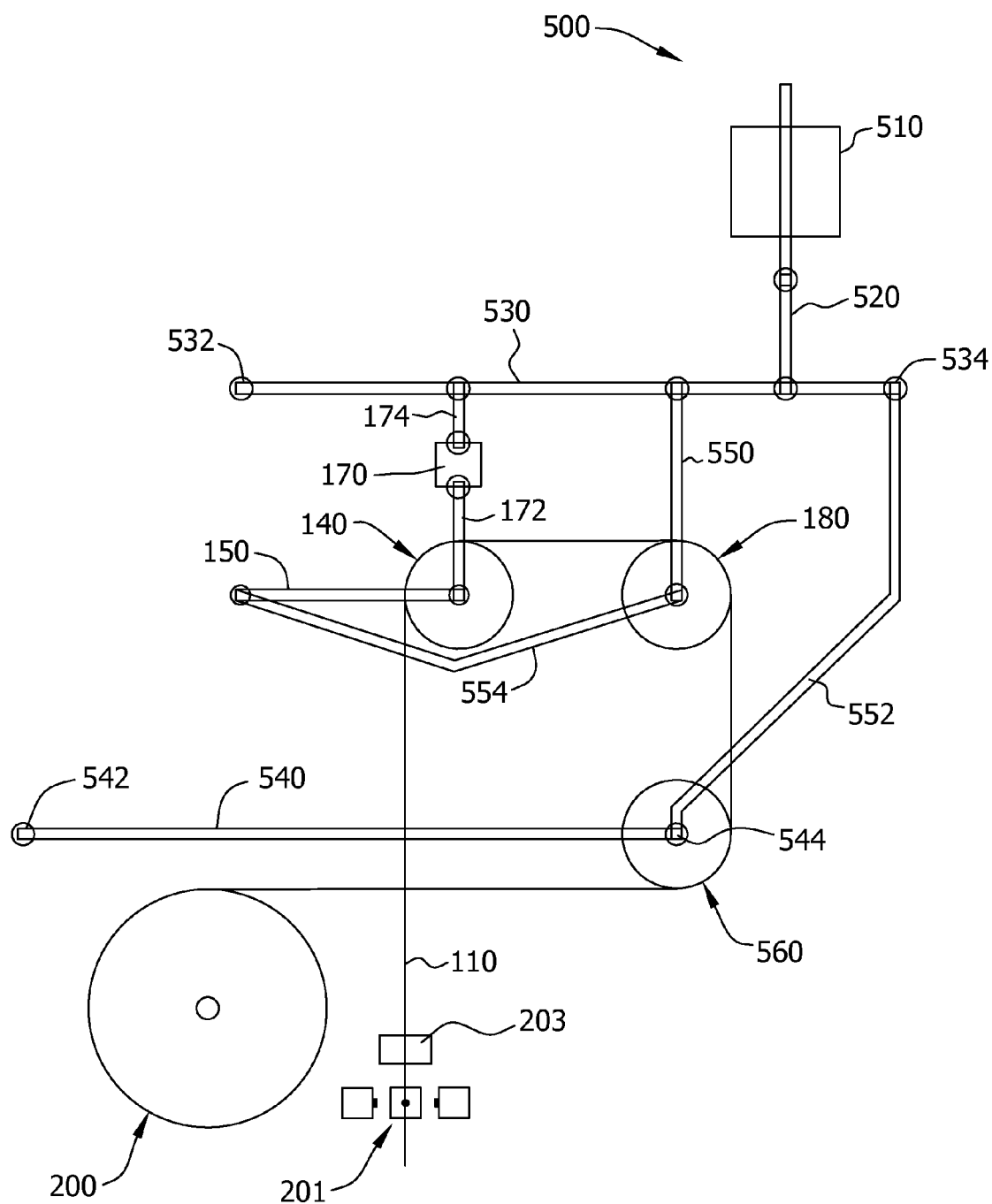
FIG. 21 is a side view of another embodiment of a pulling system.
Figure 22:
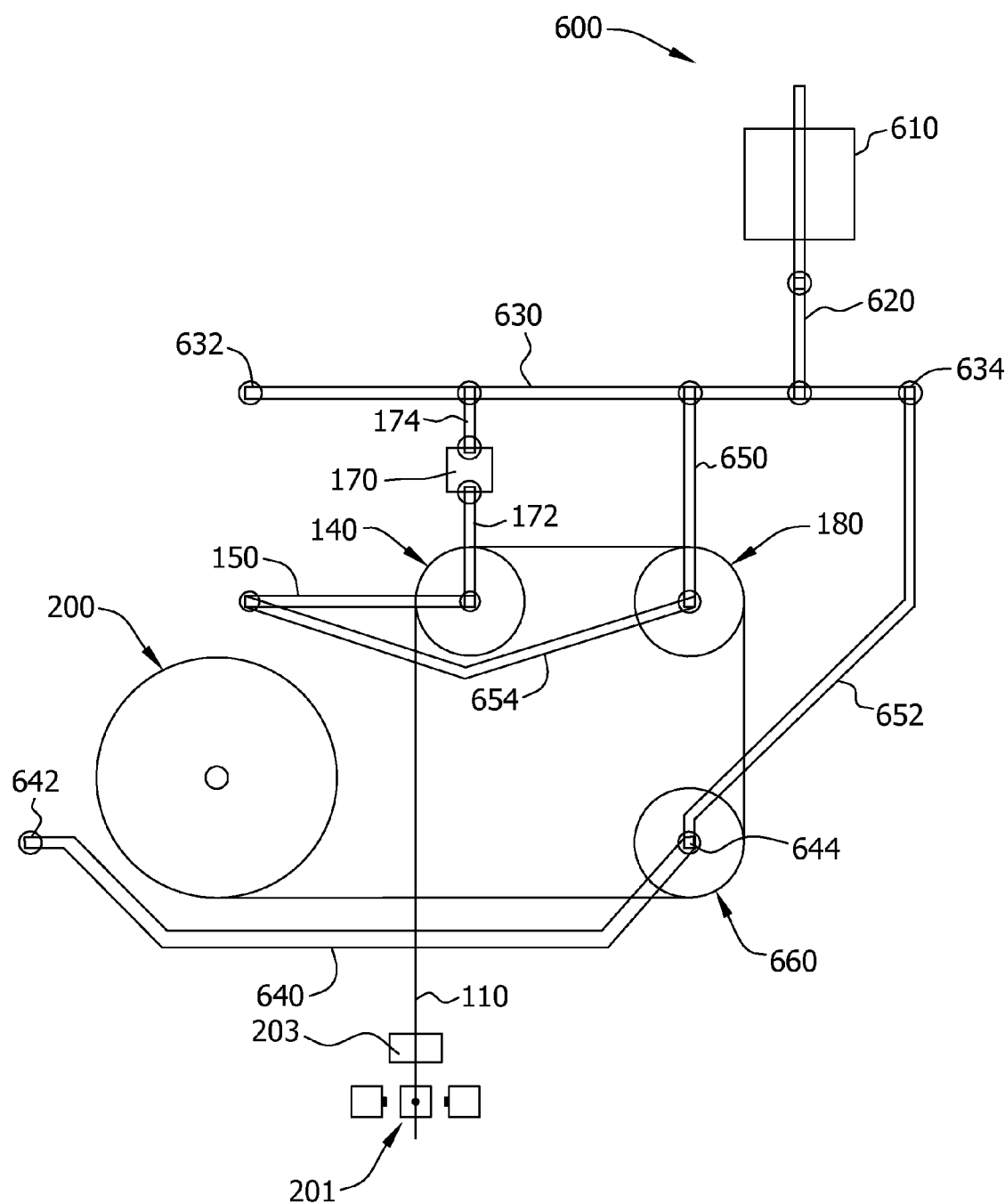
FIG. 22 is a side view of another embodiment of a pulling system.

In FIG. 20, the relative lengths of the distances on the upper arm 430 from the first end 432 to the points thereon where the second connector 174 and links 450, 452, 454 are coupled thereto are approximately 1.0, 1.5, and 2.0 or multiples thereof, respectively. The relative length of the arm 440 is 1.5. In FIGS. 21 and 22, the relative lengths are approximately 1.0, 2.0, and 3.0 or multiples thereof, respectively. Accordingly, FIG. 20 represents a more "compact" configuration when compared to the embodiments shown in FIGS. 21 and 22.

FIG. 21 shows a pulling system 500 which is similar to the pulling system 400 shown in FIG. 20 and operates in a similar manner. However, the drum 200 is positioned laterally to the left of the load cell pulley 140 and the cable pays off of a top section of the drum. In FIG. 21, the space on the left hand side of the pulling system 500 is used by moving the drum 200 to that side and generally relieving constraints on the size and placement of the drum.

Pulling system 500 includes a frame (not shown) with an actuator 510 coupled thereto. The actuator 510 may be any suitable actuator capable of moving an actuator link 520 coupled thereto between a raised and lowered position. For example, actuator 510 may be a linear actuator, a rotary drive source used in conjunction with a cam and follower, or a rotary drive source with the link 520 coupled thereto.

The actuator link 520 is coupled to an upper arm 530. The upper arm 530 is rigid and pivotably coupled at a first end 532 to the frame. In the embodiment of FIG. 21, a second end 534 is coupled to a link 552 which is in turn coupled to an additional pulley 560. A lower arm 540 is pivotably coupled to the frame at a first end 542 and rotatably coupled to the additional pulley 560 at a second end 544.

Like the pulling system 100 described above, the arm 150 is pivotably coupled to the frame at one end, and rotatably coupled to the load cell pulley 140 at its other, opposite end. Links 550, 552, 554 are rigid members which pivotably couple the other pulleys (i.e., idler pulley 180, and additional pulley 560) to either the frame and/or the upper arm 530.

The load cell 170 is pivotably coupled to the load cell pulley 140 at its center axis by the first connector. The load cell 170 is pivotably coupled to the upper arm 530 by the second connector 174. The drum 200 is coupled to the frame 130, as in pulling system 100.

Displacement of the actuator link 520 by the actuator 510 results in corresponding displacement of the upper arm 530. The upper arm 530 pivots about the first end 532 in response to the displacement of the actuator link 520, as the first end is pivotably coupled to the frame. The displacement of the upper arm 530 results in a corresponding displacement of the links 550, 552 and second connector 174 coupled thereto, which in turn causes displacement of the load cell 170 and pulleys 140, 180, and 560.

FIG. 22 shows a pulling system 600. The configuration of the lower arm 640 (lower arm 540 in FIG. 21) in this arrangement differs from that of FIG. 21. The lower arm 640 has two bends formed therein and passes below the drum 200. Moreover, the cable 100 pays off of a bottom section of the drum 200. The configuration of the pulling system 600 in FIG. 9 is more compact vertically when compared to the pulling system 500 in FIG. 21.

The location of the drum 200 in FIG. 22 may be modified, but if the cable region between the drum and an additional pulley 660 is horizontal, a lower arm 640 has one or more bends to prevent contact with the drum.

Pulling system 600 includes a frame (not shown) with an actuator 610 coupled thereto. The actuator 610 is any suitable actuator capable of moving an actuator link 620 coupled thereto between a raised and lowered position. For example, actuator 610 may be a linear actuator, a rotary drive source used in conjunction with a cam and follower, or a rotary drive source with the link 620 coupled thereto.

The actuator link 620 is coupled to an upper arm 630. The upper arm 630 is rigid and pivotably coupled at a first end 632 to the frame. In the embodiment of FIG. 22, a second end 634 is coupled a link 652 which is in turn coupled the additional pulley 660. The lower arm 640 is pivotably coupled to the frame at a first end 642 and rotatably coupled to the additional pulley 660 at a second end 644.

Like the pulling system 100 described above, the arm 150 is pivotably coupled to the frame at one end, and rotatably coupled to the load cell pulley 140 at its other, opposite end. Links 650, 652, 654 are rigid members which pivotably couple the other pulleys (i.e., idler pulley 180, and additional pulley 660) to either the frame and/or the upper arm 630.

The load cell 170 is pivotably coupled to the load cell pulley 140 at its center axis by the first connector. The load cell 170 is pivotably coupled to the upper arm 630 by the second connector 174. The drum 200 is coupled to the frame, as in pulling system 100.

Displacement of the actuator link 620 by the actuator 610 results in corresponding displacement of the upper arm 630. The upper arm 630 pivots about the first end 632 in response to the displacement of the actuator link 620, as the first end is pivotably coupled to the frame. The displacement of the upper arm 630 results in a corresponding displacement of the links 650, 652 and second connector 174 coupled thereto, which in turn causes displacement of the load cell 170 and pulleys 140, 180, and 660.

Figure 23:
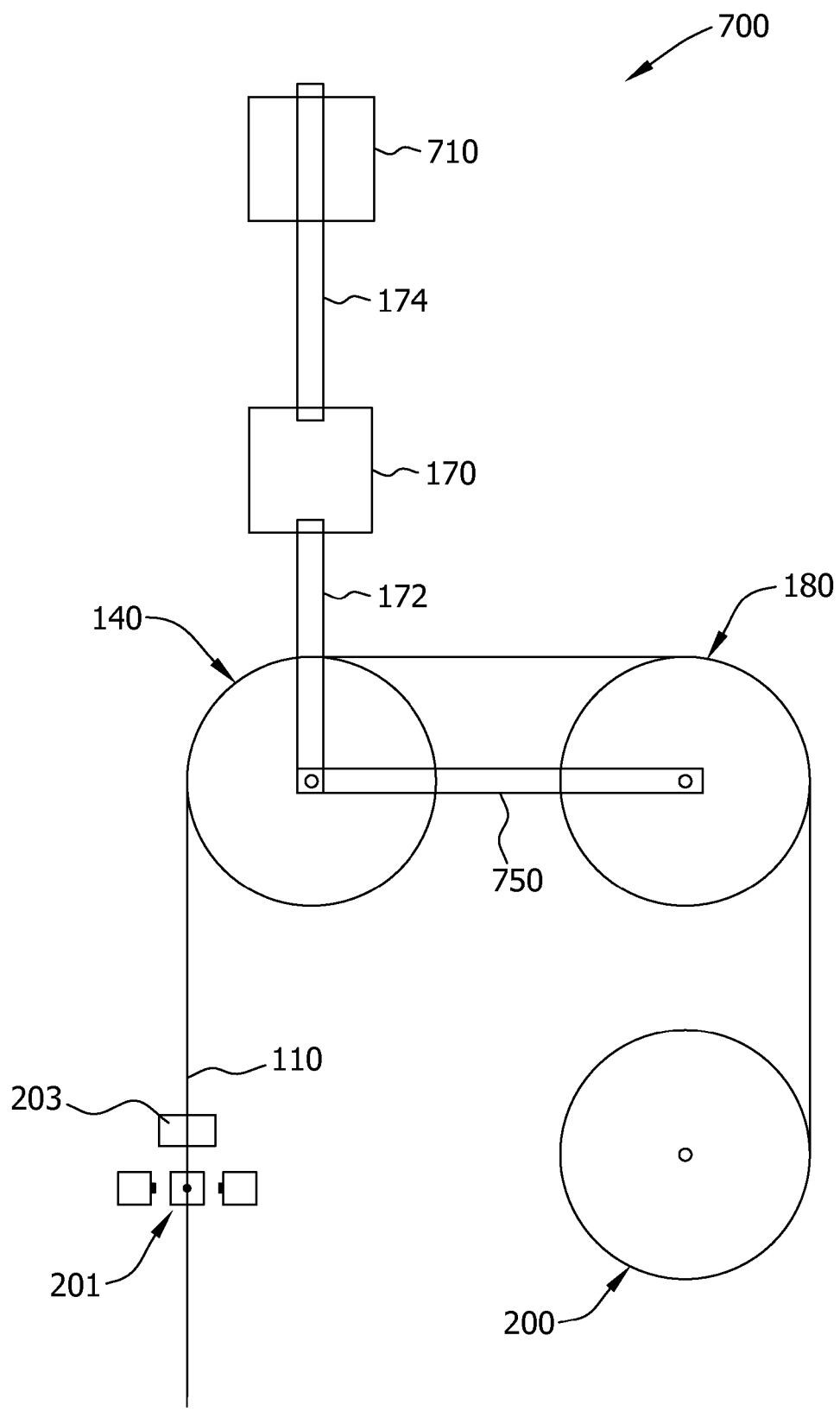
FIG. 23 is a side view of another embodiment of a pulling system in an initial position.

FIG. 23 shows another arrangement of a pulling system 700 in an initial position. In the embodiment of FIG. 23, the actuator 710 is coupled to the second connector 174, which is in turn coupled to the load cell 170. The load cell 170 is coupled by the first connector 172 to the load cell pulley 140 at the center axis of the pulley. An arm 750 couples the idler pulley 180 at its center axis to the center axis of the load cell pulley 140. The drum 200, like the other arrangements, is rotatably coupled to the frame. The actuator 710 thus displaces the second connector 174 directly, without the need for an upper arm. Displacement of the actuator results in corresponding displacement of the load cell 170 and load cell pulley 140. Idler pulley 180 is pivotably coupled to the frame by an axle or pin at its center axis. The idler pulley 180 is not displaced when the actuator 710 displaces second connector 174, load cell 170, first connector 172, and load cell pulley 140.

The idler pulley 180 may not be coupled to the frame by a pin or axle at its center axis, according to some embodiments. In these embodiments, the load cell pulley 140 and the idler pulley 180 may be displaced upon displacement of the first connector 172. Additional arm(s) and attachment points to the frame may then be used to keep idler pulley 180 constrained to its allowed path. In addition, the drum 200 could rotate backwards to keep the cable portion between the load cell pulley 140 and the idler pulley 180 stationary while the actuator 710 displaces the load cell pulley and idler pulley upward.

Figure 24:
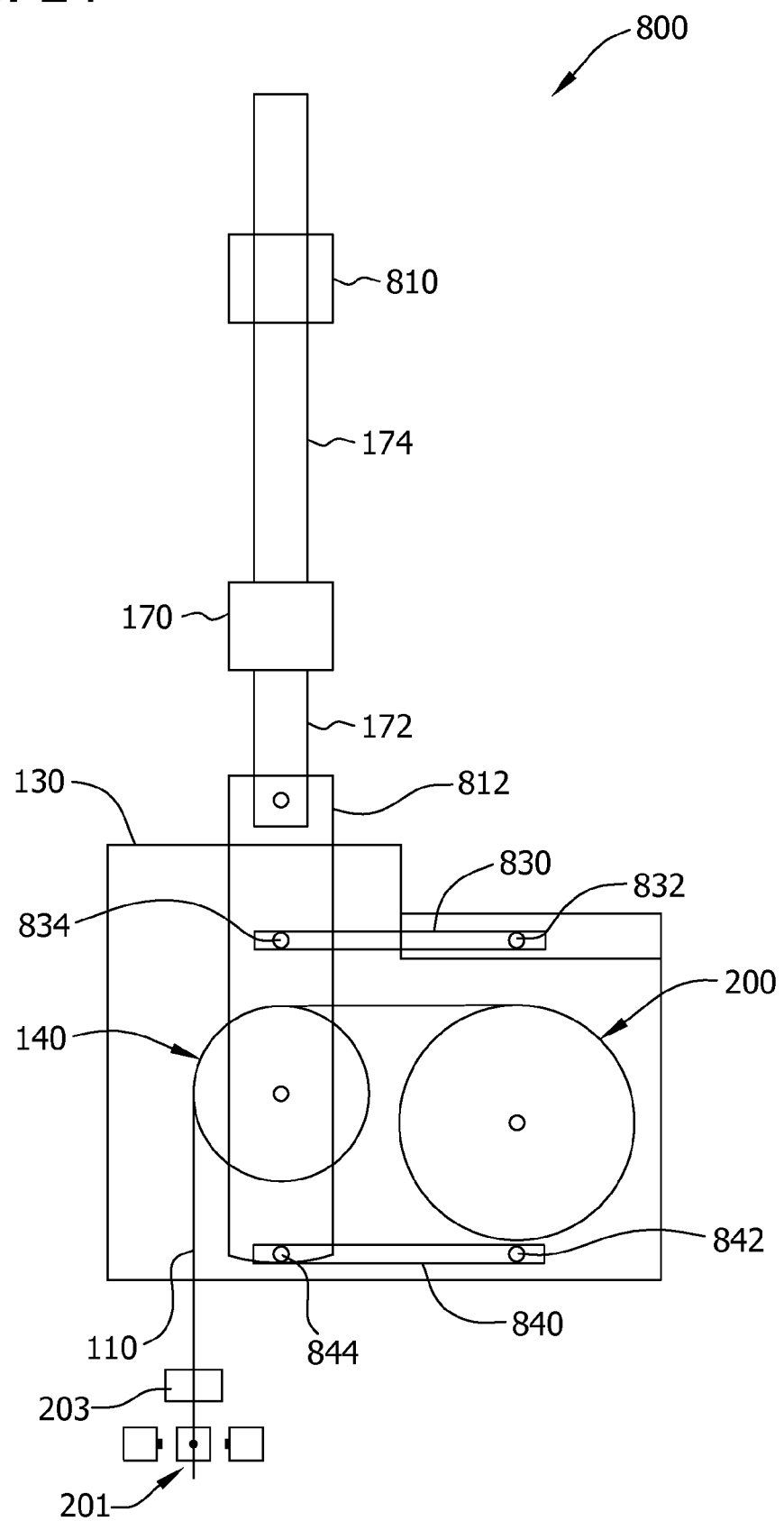
FIG. 24 is a side view of another embodiment of a pulling system in an initial position.

FIG. 24 shows another embodiment of a pulling system, referred to generally at 800. FIG. 24 shows the pulling system 800 in the initial position. The second connector 174 couples the load cell 170 to the actuator 810. A bar 812 is coupled to the first connector 172 such that displacement of the first connector results in corresponding displacement of the bar. The bar 812 is suitably formed of a rigid material. An upper arm 830 is pivotably coupled at its first end 832 to the frame 130 and at its second end 834 to the bar 812. The upper arm 830 is disposed above the drum 200 and the load cell pulley 140 in the frame 130. A lower arm 840 is pivotably coupled at its first end 842 to the frame 130 and at its second end 844 to the bar 812. The lower arm 840 is disposed below the drum 200 and the load cell pulley 140 in the frame 130. The load cell pulley 140 is pivotably coupled at its center axis to the bar 812.

Accordingly, displacement of the actuator 810 results in corresponding displacement of the bar 812 as the second connector 174, load cell 170, and first connector 172 couple the bar to the actuator. Displacement of the bar 812 in turn causes corresponding displacement of the load cell pulley 140 and the upper arm 830 and lower arm 840 coupled thereto.

Figure 25B:
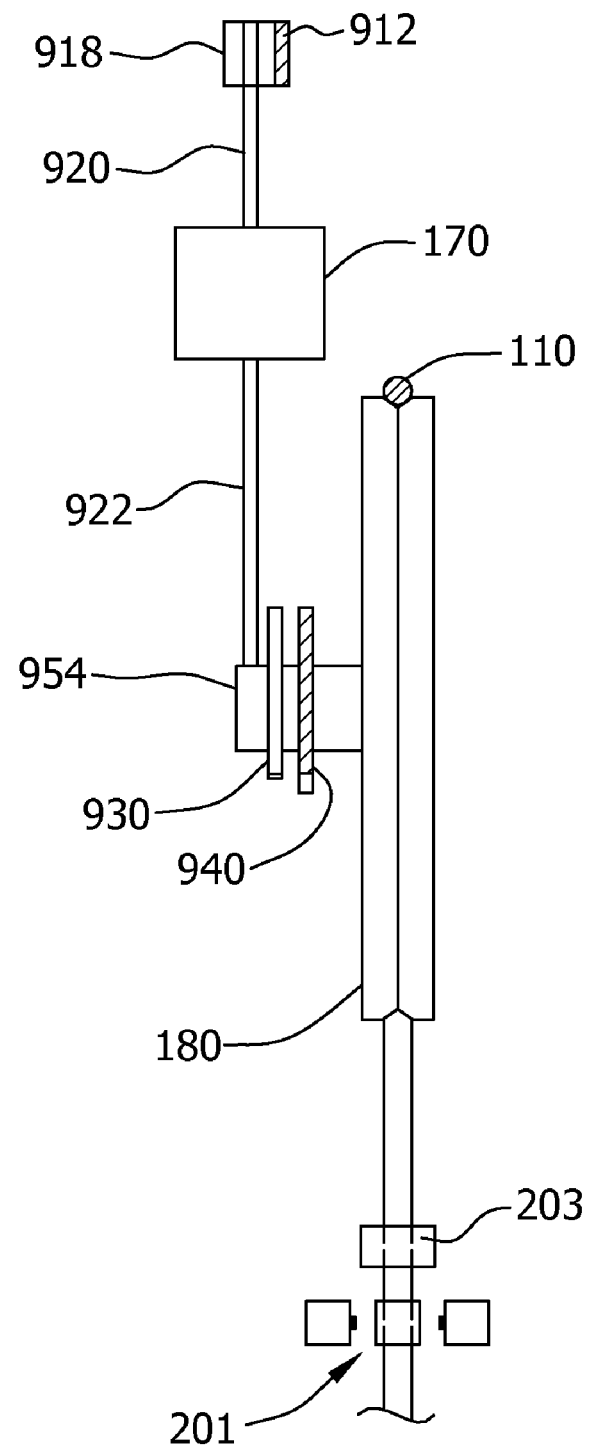
FIG. 25B is a cross-section taken in the plane of 25B-25B of FIG. 25A.

FIGS. 25A and 25B show another embodiment of a pulling system, referred to generally at 900. FIG. 25A shows the pulling system 900 in the initial position. Pulling system 900 includes a frame (not shown) with an actuator 910 coupled thereto. The actuator 910 is any suitable actuator capable of moving an actuator link 902 coupled thereto between a raised and lowered position. For example, actuator 910 may be a linear actuator, a rotary drive used in conjunction with a cam and follower, or a rotary drive with a link coupled thereto.

A first lower arm 930 couples the load cell pulley 140 to the idler pulley 180. A second lower arm 940 couples the idler pulley 140 to an additional pulley 960. The first lower arm has a distal end 932 spaced apart from a proximal end 934. The proximal end 934 is disposed at or near the center axis of the idler pulley 180 and the distal end 932 is disposed at or near the center axis of the load cell pulley 140. Similarly, the second lower arm 940 has a distal end 942 spaced apart from a proximal end 944. The proximal end 944 is disposed at or near the center axis of the idler pulley 180 and the distal end 942 is disposed at or near the center axis of the additional pulley 960. The distal ends 932, 942 are suitably pivotably coupled to the load cell pulley 140 and additional pulley 960, respectively. The proximal ends 934, 944 of the lower arms 930, 940 are suitably pivotably coupled to the idler pulley 180 at a center coupling 954. The first lower arm 930 and second lower arm 940 are thus able to move independent of each other.

The actuator link 902 is coupled to an upper arm 912. The upper arm 912 is rigid and pivotably coupled at a first end 916 to the actuator link 902. In other embodiments, the actuator link 902 may be differently positioned along the upper arm without departing from the scope of the embodiments. A second end 918 (spaced-apart from the first end 916) of the upper arm 912 is pivotably coupled to a first connector 920. The upper arm 912 has a center coupling 914 which is pivotably coupled to the frame. In the illustrated embodiment, the center coupling 914 is disposed at the mid-point of the upper arm 912, thus coupling the upper arm to the frame at the mid-point. In other embodiments, the center coupling 914 is not disposed at the mid-point of the upper arm 912 and is spaced away from the mid-point of the upper arm. In these embodiments, the upper arm 912 is thus not coupled to the frame at its mid-point.

The first connector 920 is in turn pivotably coupled to the load cell 170. The load cell 170 is pivotably coupled to the load cell pulley 140 at its center axis by a second connector 922. The second connector 922 also couples the load cell 170 to the first lower arm 930. A third connector 924 couples the upper arm 912 at its first end 916 to the second lower arm 940 at its distal end 942. The drum 200 is coupled to the frame, as in the pulling system 100 described above.

As shown in FIG. 25B, the first lower arm 930 and second lower arm 940 are separate, distinct members. The connection between the first lower arm 930 and second lower arm 940 and the frame are shown as simple pinned connections for clarity. In other embodiments, the connections may be made through the use of yokes or other suitable connection methods in order to eliminate or reduce bending moments at the connections. The lower arms 930, 940 are both pivotably coupled at their respective proximal ends 934, 944 to the idler pulley and/or the frame. The lower arms 930, 940 may be coupled in an overlapped arrangement as shown in FIG. 25B, or in any other arrangement. The proximal ends 934, 944 are suitably separated by a bearing, spacer, washer, or other suitable structure such that they are able to rotate independent of each other (i.e., rotation of the first lower arm 930 does not necessarily require or result in rotation of the second lower arm 940, or vice versa). The lateral position of the lower arms 930, 940 within the frame is thus substantially fixed in place with respect to the frame, and the lower arms are able to rotate about their respective proximal ends 934, 944 independent of each other.

Moreover, in other embodiments the actuator 910 and actuator link 902 are not used. Instead, a rotational drive source is coupled to the upper arm 912 at any point along the upper arm. In some embodiments, the rotational drive source may be coupled to the upper arm 912 at or near the center coupling 914 of the upper arm. One or more speed reduction or torque multiplying devices (e.g., a planetary gear reduction device) may be used in conjunction with the rotational drive source. Additionally, the rotational drive source may be a rotary stage utilizing a stepping drive or motor.

The connectors 920, 922, 924 and actuator link 902 are generally rigid structures. Accordingly, displacement of the actuator 910 results in corresponding displacement of the first end 916 of upper arm 912 as the actuator link 902 couples the upper arm to the actuator. The upper arm 912 rotates or pivots about its center coupling 914 upon displacement of the first end 916 of the upper arm 912 by the actuator link 902. Displacement of the upper arm 912 in turn causes corresponding displacement of the connectors 920, 922, 924 and load cell 170 as the first connector couples the second end 918 of the upper arm to load cell and the second connector is in turn pivotably coupled to the load cell.

Accordingly, the displacement of the connectors 920, 922, 924 results in corresponding displacement of the load cell pulley 140 and additional pulley 960, respectively. The lower arms 930, 940 are correspondingly displaced as well. The lower arms 930, 940 substantially restrain the load cell pulley 140 and additional pulley 960 from lateral movement as the proximal ends 934, 944 of the lower arms are pivotably coupled to the frame and the idler pulley 180. The actuator 910 may subsequently retract or raise the actuator link 902, resulting in corresponding upward displacement of the additional pulley 960 and downward displacement of the the of the load cell pulley 140. Moreover, as compared to the other previously described embodiments, the embodiments of FIGS. 25A-25B and those described below have unique advantages. The actuator 910 is not required to lift the entire weight of the object, as the arms 912, 930, 940 and additional pulley 960 cooperate with the load cell pulley 110 and idler pulley 180 to balance the load imparted on the cable 110 by the object attached thereto.

The pulling systems in FIGS. 25A-25B are configured to permit the drum 200 to rotate at a substantially constant rate and raise the cable 110 at a rate suitable for use in silicon crystal growth embodiments. The lengths of the connectors 920, 922, 924, upper arm 912, and lower arms 930, 940 may be configured to maintain a substantially constant length of cable 110 between the additional pulley 960 and the load cell pulley 140 as the upper arm 912 is displaced by the actuator link 902. Thus, the vertical motion of the pulleys 140, 960, the upper arm 912, connectors 920, 922, 924, and lower arms 930, 940 may be made independent of the rotational motion of the drum 200, thus enabling the cable 110 to remain static with respect to the load cell pulley 140 during weighing of the object.

Figure 26:
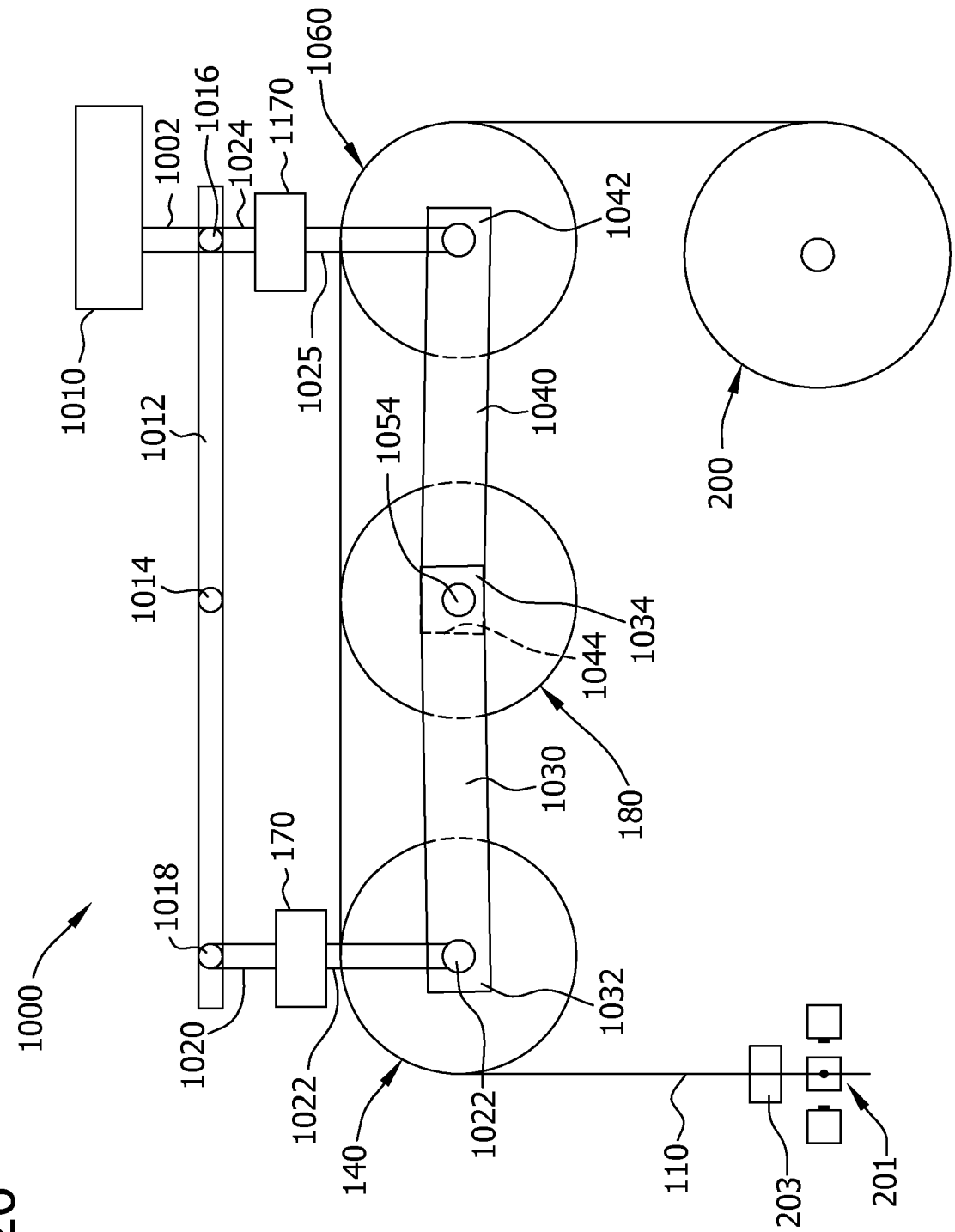
FIG. 26 is a side view of another embodiment of a pulling system in an initial position.

FIG. 26 shows another arrangement of a pulling system 1000 in an initial position. The pulling system 1000 is movable between an upper position and a lower position similar to that of the pulling system 900 shown in FIGS. 25B, respectively. In the embodiment of FIG. 26, an additional load cell 1170 is used in conjunction with the load cell 170. The additional load cell 1170 is positioned in between and pivotably coupled on opposing ends to a third connector 1024 and a fourth connector 1025. The additional load cell 1170 is used to provide additional information on impediments to motion in the pulling system 1000. For example, measurements taken by the additional load cell 1170 are indicative of the friction present in the pulling system 1000. If the measurements taken by the load cell 1170 do not correspond with those taken by the load cell 170, the bearings and/or pulleys in the pulling 1000 may be defective or out of alignment.

The pulling system 1000 may include the same components as those of FIGS. 25A-25B. The components may include: the cable 110, the load cell pulley 140, the load cell 170, the idler pulley 180, the drum 200, an actuator link 1002, an actuator 1010, an upper arm 1012, an upper arm center coupling 1014, an upper arm first end 1016, an upper arm second end 1018, a first connector 1020, a second connector 1022, the third connector 1024, the fourth connector 1025, a first lower arm 1030 having a distal end 1032 and a proximal end 1034, a second lower arm 1040 having distal end 1042 and a proximal end 1044, a center coupling 1054, and an additional pulley 1060.

Figure 27A:
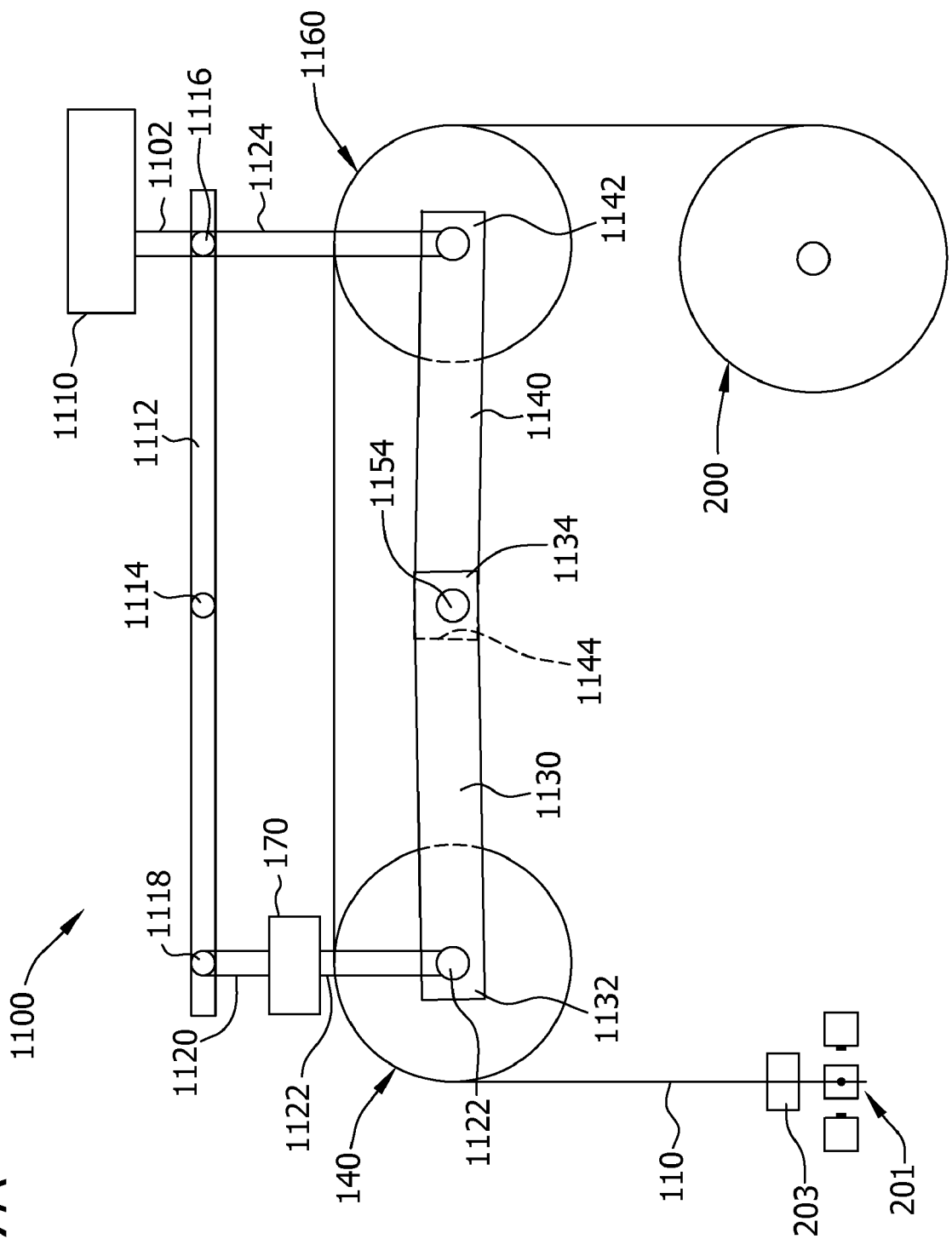
FIG. 27A is a side view of another embodiment of a pulling system in an initial position.
Figure 27B:
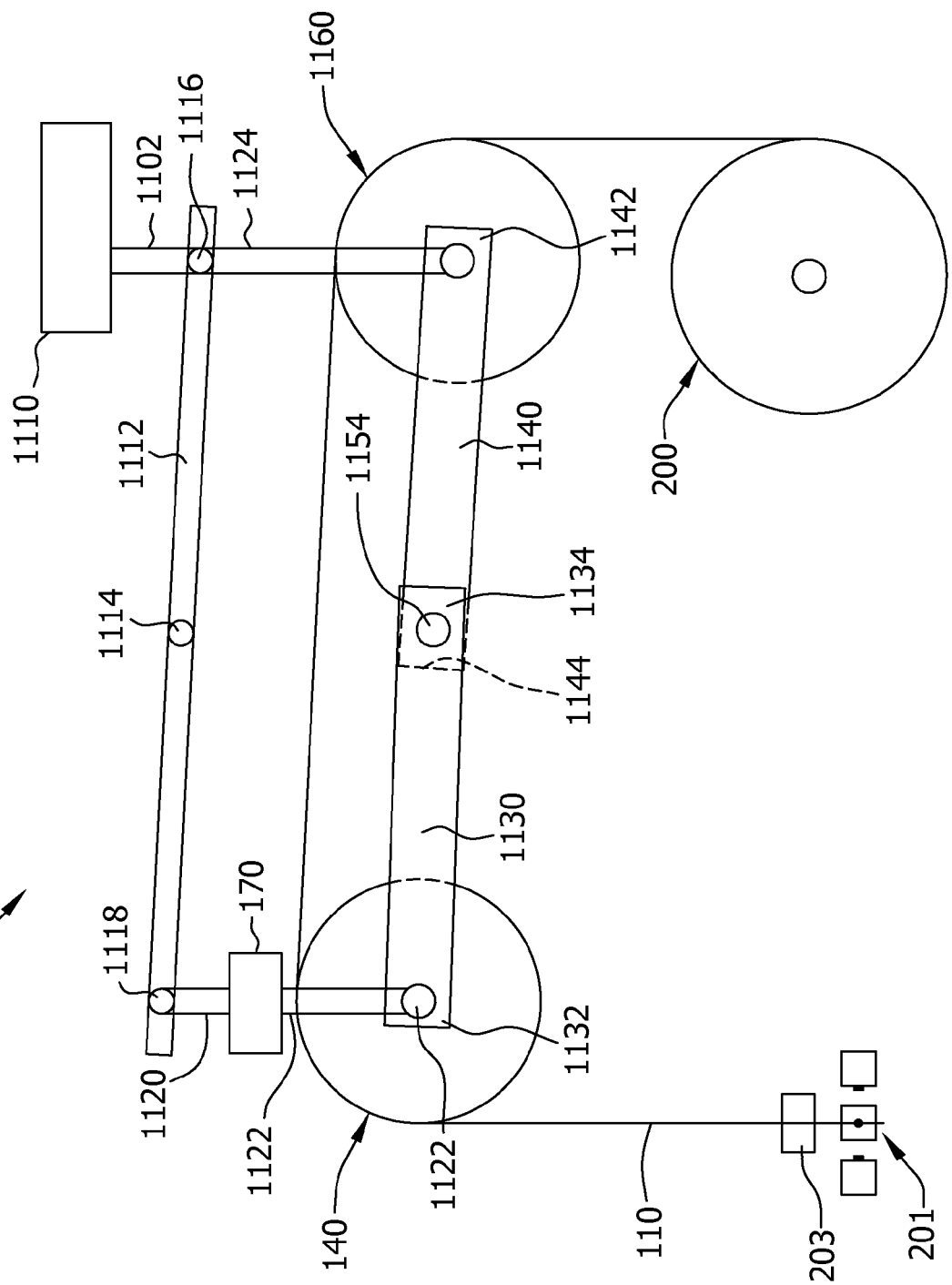
FIG. 27B is a side view of the pulling system of FIG. 27A in an upper position.
Figure 27C:
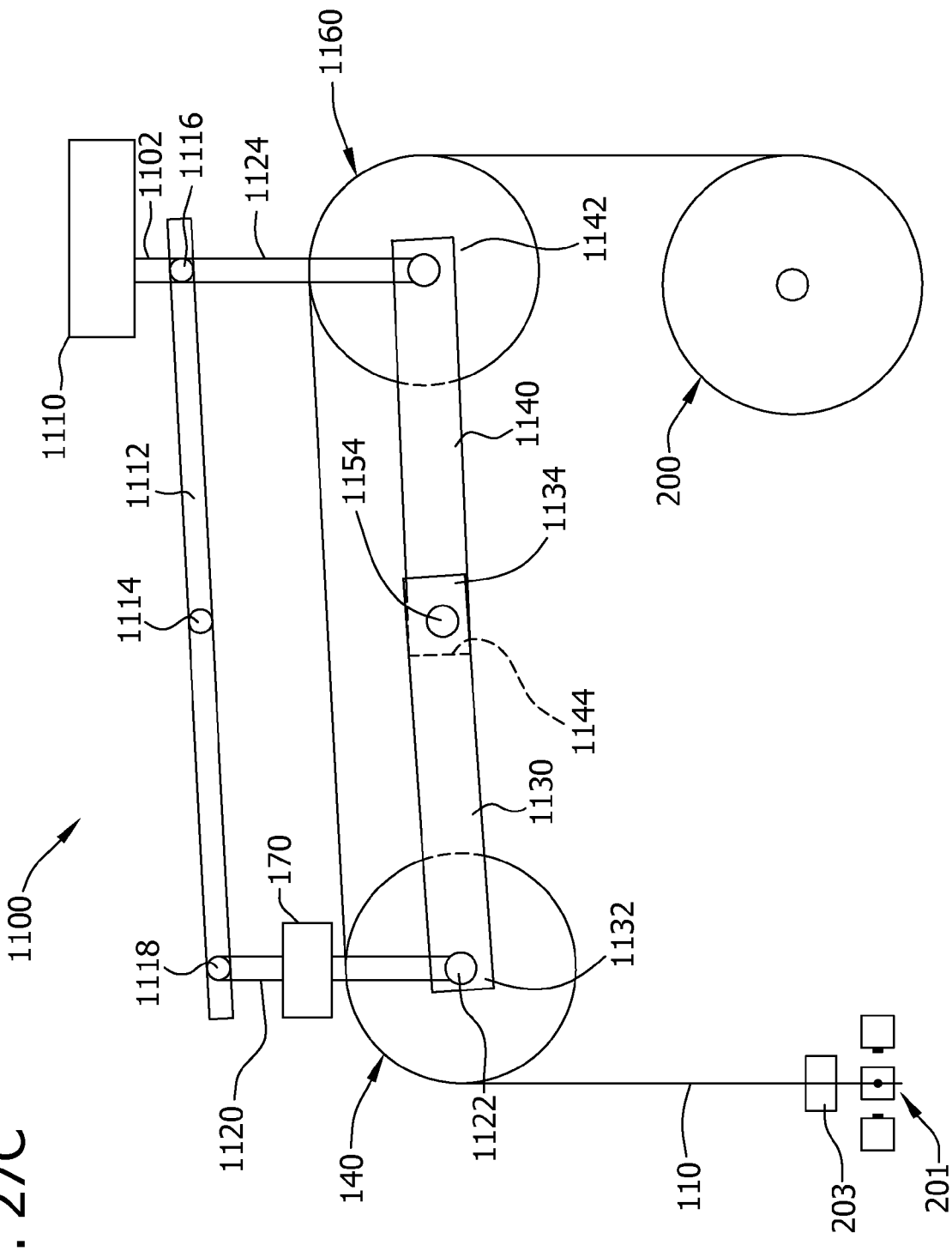
FIG. 27C is a side view of the pulling system of FIG. 27A in a lower position.

FIGS. 27A-27C show another arrangement of a pulling system 1100 in three distinct positions. FIG. 27A shows the pulling system 1100 in the initial position, FIG. 27B shows the system in an upper position, while FIG. 27C shows the system in a lower position. The pulling system 1100 may include the same components as those of FIGS. 25A-25E, with the exception of the idler pulley 180. The components include: the cable 110, the load cell pulley 140, the load cell 170, the drum 200, an actuator link 1102, an actuator 1110, an upper arm 1112, an upper arm center coupling 1114, an upper arm first end 1116, an upper arm second end 1118, a first connector 1120, a second connector 1122, a third connector 1124, a first lower arm 1130 having a distal end 1132 and a proximal end 1134, a second lower arm 1140 having distal end 1142 and a proximal end 1144, a center coupling 1154, and an additional pulley 1160.

The embodiment of FIGS. 27A-27C differ from that of FIGS. 25A and 25B in that an idler pulley is not included. Instead, the first lower arm 1130 and second lower arm 1140 are pivotably coupled to the frame.

Figure 28:
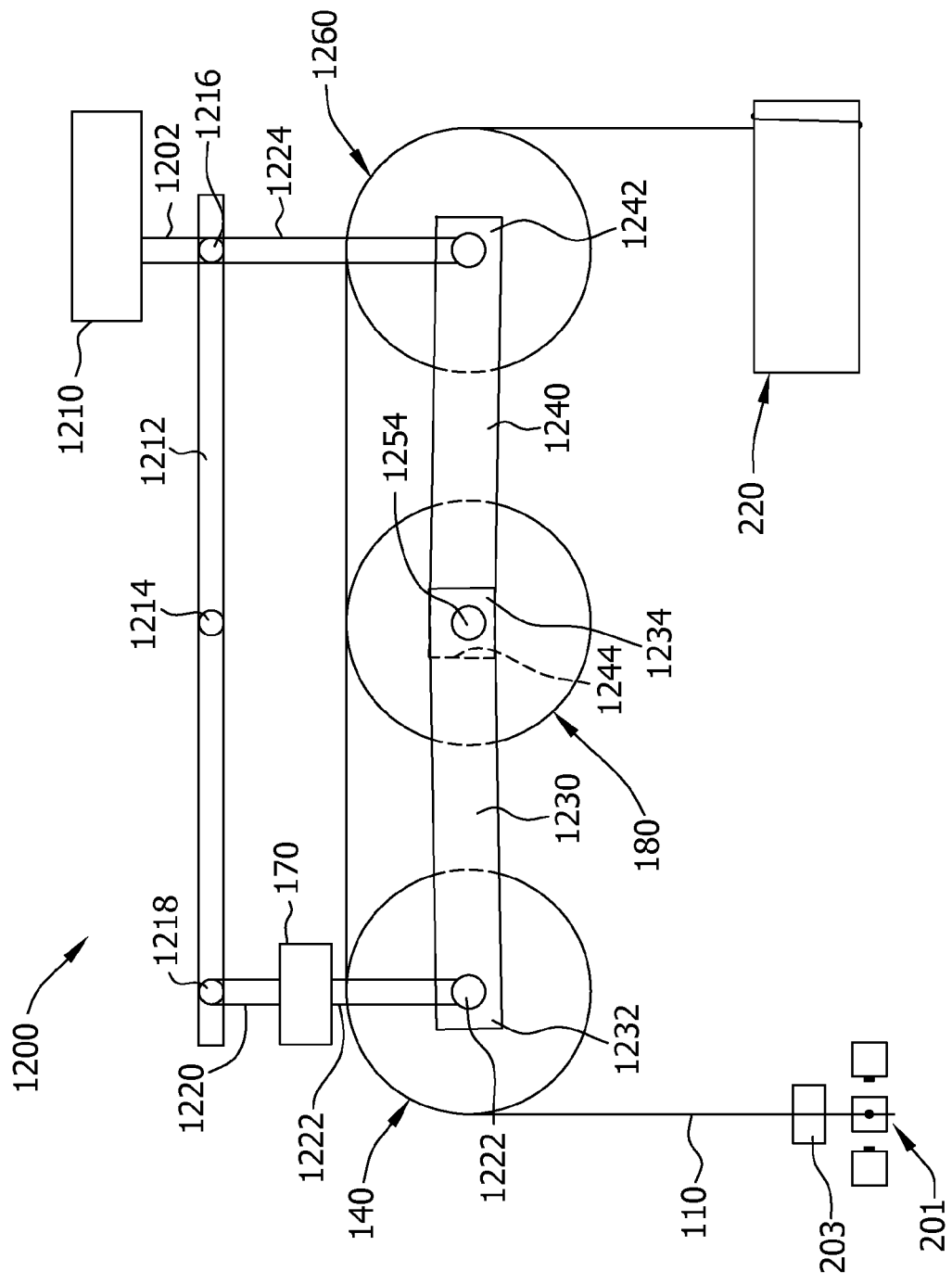
FIG. 28 is a side view of another embodiment of a pulling system in an initial position.

FIG. 28 shows another embodiment of a pulling system 1200 in an initial position. The pulling system 1200 is capable of translation between an upper and lower position as described above in relation to FIGS. 20-27. The pulling system 1200 utilizes the same components as those of FIGS. 25A and 25B. The components include: the cable 110, the load cell pulley 140, the load cell 170, the idler pulley 180, the position sensor 201, the bushing 201, an actuator link 1202, an actuator 1210, an upper arm 1212, an upper arm center coupling 1214, an upper arm first end 1216, an upper arm second end 1218, a first connector 1220, a second connector 1222, a third connector 1224, a first lower arm 1230 having a distal end 1232 and a proximal end 1234, a second lower arm 1240 having distal end 1242 and a proximal end 1244, a center coupling 1254, and an additional pulley 1260.

The pulling system 1200 generally differs from those described above in that a drum 220 is rotated by approximately 90 degrees with respect to the position of the drum 200 in the other pulling systems. Accordingly, the center axis of the drum 220 lies in a plane that is perpendicular to a plane or planes containing the center axes of the other pulleys 140, 180, 1260 in the pulling system 1200. According to some embodiments, the drum 220 is mounted on a splined shaft and is able to slidably move along the shaft in a direction parallel to its axis of rotation to maintain a generally perpendicular angle between the cable 110 and the outer surface of the drum. In other embodiments, the drum may instead not slide along its axis of rotation and instead have grooves formed therein that a continually changing pitch. From the perspective of FIG. 28, the pitch of the grooves would increase as they progressed from right to left along the outer surface of the drum 220.

In operation, the pulling systems of FIGS. 20-24 ensure the static relationship between the cable 110 and the load cell pulley 140 by selectively raising and lowering (or oscillating) the load cell pulley with an actuator. The process begins by lowering the load cell pulley 140 with the actuator from an initial, substantially horizontal position (as shown in FIG. 23, for example) to a lower position. The actuator then pulls the load cell pulley 140 and the object attached to the end of the cable 110 upward, while the cable remains substantially static with respect to the load cell pulley. When the load cell pulley 140 reaches an upper-most position, the actuator lowers the load cell pulley while the drum 200 is simultaneously rotated and a portion of cable 110 is reeled in. The length of the portion of the cable 110 reeled in by the drum 200 may be sized such that the object continues to move upward as the load cell pulley 140 is lowered by the actuator from the upper position to the lower position. The process then repeats and the load cell pulley 140 is lifted once again. Accordingly, the object attached to the cable 110 may be raised and weighed simultaneously while the cable 110 remains stationary with respect to the load cell pulley. Errors introduced by the varying diameter of the cable 110 are thus effectively eliminated.

In some embodiments, such as those shown in FIGS. 25-31, the drum 200 is rotated at a constant rate while the load cell pulley 140 is raised and lowered as needed for accurate measurement of the weight of the object coupled to the cable 110. The rate at which the drum 200 rotates and reels the cable 110 in while the actuator lowers the load cell pulley 140 is configured such that the position of the object continues to move upward at substantially the same rate throughout the process.

Returning now to the use of the pulling systems 100, 400, 500, 600, 700, 800, 900, 1000, 1100, 1200 in silicon ingot growth embodiments, specific reference is made below to the pulling system 100, but it should be understood that the pulling systems 400, 500, 600, 700, 800, 900, 1000, 1100, 1200 may be used instead of pulling system 100. In at least some embodiments, the bushing 203 may be translated from the first position to the second position at or near the beginning of the end cone growth. The translation of the bushing 203 to the second position eliminates contact between the bushing and the cable 110, thus eliminating frictional forces imparted on the cable by the bushing. Generally, the bushing 203 may be translated from one position to the other at any stage of the process.

The weight of the object coupled to the cable 110 (i.e., the growing silicon ingot 114) is communicated by the processor 300 to the control system 320. The control system 320 utilizes the weight of the growing silicon ingot in the control of the silicon ingot growth process. For example, the weight is used to control the rate at which the growing silicon ingot 114 is pulled upward or the rate at which the frame 130 is rotated. As described above, a rotary encoder may be used in conjunction with the drive coupled to the drum 200 to determine the number of revolutions (and fractions thereof) of the drum. The displacement of the cable 110 parallel to the Y axis is determinable by the control system 320 since the circumference of the drum 200 and the diameter of the cable are known. The length of the growing silicon ingot 114 is therefore determinable based on the displacement of the cable 110, or, in the case of pulling systems 400, 500, 600, 700, or 800, the displacement imparted on the load cell pulley 140 by the actuator 410. Other embodiments may use different methods to measure the length of the growing silicon ingot 114.

The density of the growing silicon ingot 114 is known, and is a relatively constant value under normal operating conditions. Accordingly, the diameter of the growing silicon ingot 114 is calculated based on the weight (determined by the processor 300) and the length of the ingot. For example, given a silicon ingot of length l, density ρ, and mass M, the diameter D is represented by the equation $$D = 2\sqrt{\frac{M}{\rho \cdot l \cdot \pi}}.$$

This equation represents an "average" diameter of an ingot of substantial length l. The diameter D of the portion of the ingot being grown at the time of the force measurement is the quantity that is the objective of the measurement. This instantaneous diameter D of the portion being grown at the time of measurement can be represented by the equation $$D = 2\sqrt{\frac{dM/dt}{\rho \cdot v \cdot \pi}},$$

where v is the velocity at which the ingot is being grown, i.e., v=dl/dt, and dM/dt is the rate of change of the mass M of the ingot. As described above, both l and M are determinable, so dl/dt and dM/dt are also determinable and the instantaneous diameter D is therefore determinable.

According to some embodiments, the load cell 170 and processor 300 provide the weight of the growing silicon ingot 114 to the control system 320 at regular intervals, such as 20 to 30 times per second. In operation, the displacement of the cable 110 is likewise determined at regular intervals. In one embodiment, the control system 320 utilizes the calculated diameter D in controlling (i.e., adjusting) the rate at which the growing silicon ingot 114 is pulled upward or the rate at which heat is supplied to the molten silicon and the silicon ingot in order to ensure that the diameter of the growing silicon ingot conforms to a desired profile. Different diameter profiles are used during different portions of the growth process. For example, during the course of the silicon ingot growth process it is often desirable to maintain a constant diameter D of the growing silicon ingot 114. However, towards the end of the growth process, the diameter D is gradually decreased, resulting in the silicon ingot having a tapered end cone. Accordingly, based on the calculated diameter D of the growing silicon ingot 114, the rate at which the silicon ingot is pulled upward (either by the drum 200 or any of the actuators) may be increased to reduce the diameter D. According to some embodiments, the rate of rotation of the frame 130 (and hence the growing silicon ingot 114) or the rate at which heat is supplied is adjusted as well based on the calculated diameter D.

Prior systems use an optical measurement system to measure the diameter D of the ingot during the formation of the tapered end cone. These systems are only capable of measuring the diameter of the ingot when the tapered end cone has a relatively long length in comparison to the diameter of the end cone being grown. Accordingly, prior systems are not capable of producing silicon ingots having tapered end cones of relatively short length in comparison to their diameters. The yield of silicon ingots grown in prior systems is thus reduced, as the silicon contained in the end cone is of lesser value than the silicon contained in the rest of the ingot. The embodiments presented herein thus permit the control of the diameter D of the growing silicon ingot 114 based, at least in part, on the accurate measurement of the weight of the ingot. Accordingly, silicon ingots may be grown with tapered cones having shorter lengths than those in prior systems. In some embodiments, the length of the tapered cones may be approximately half of those in prior systems.

FIGS. 29A-31 show various embodiments of dampening pulling systems. Like the pulling systems described above in relation to FIGS. 25A-28, the dampening pulling systems shown in FIGS. 29A-31 are each movable between a lower position and an upper position. Moreover, the pulling systems are similar in configuration to those described above in relation to FIGS. 29A-31, except that a dampening system is included with the pulling system to dampen pendular motion of the cable 110 without contacting the cable. Moreover, the dampening pulling systems shown in FIGS. 29A-31 are well suited to the measurement of the weight of an object coupled to the cable 110 as the object is being lifted, as described above in relation to FIGS. 14-28.

Figure 29A:
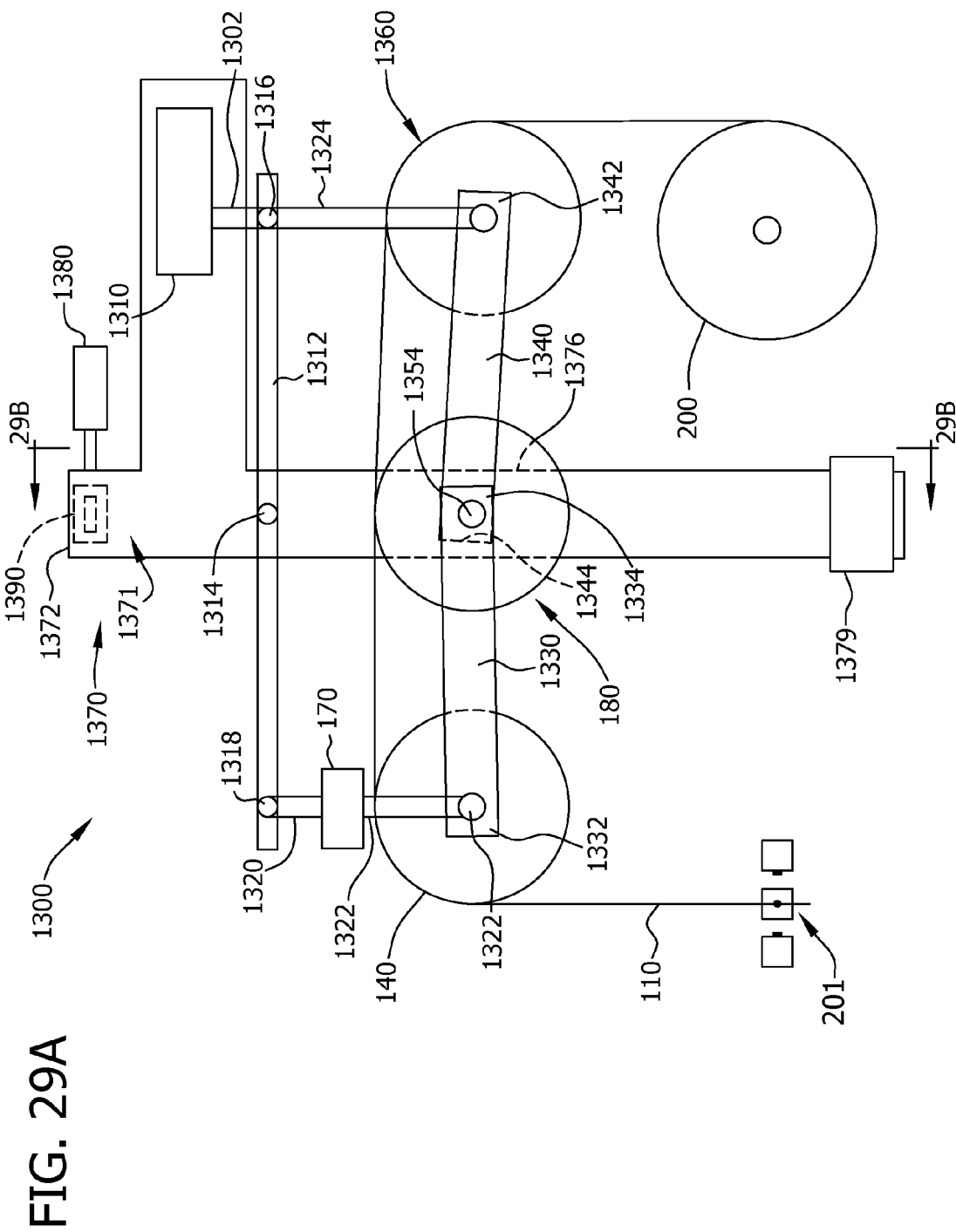
FIG. 29A is a side view of an embodiment of a dampening pulling system in an initial position.
Figure 29B:
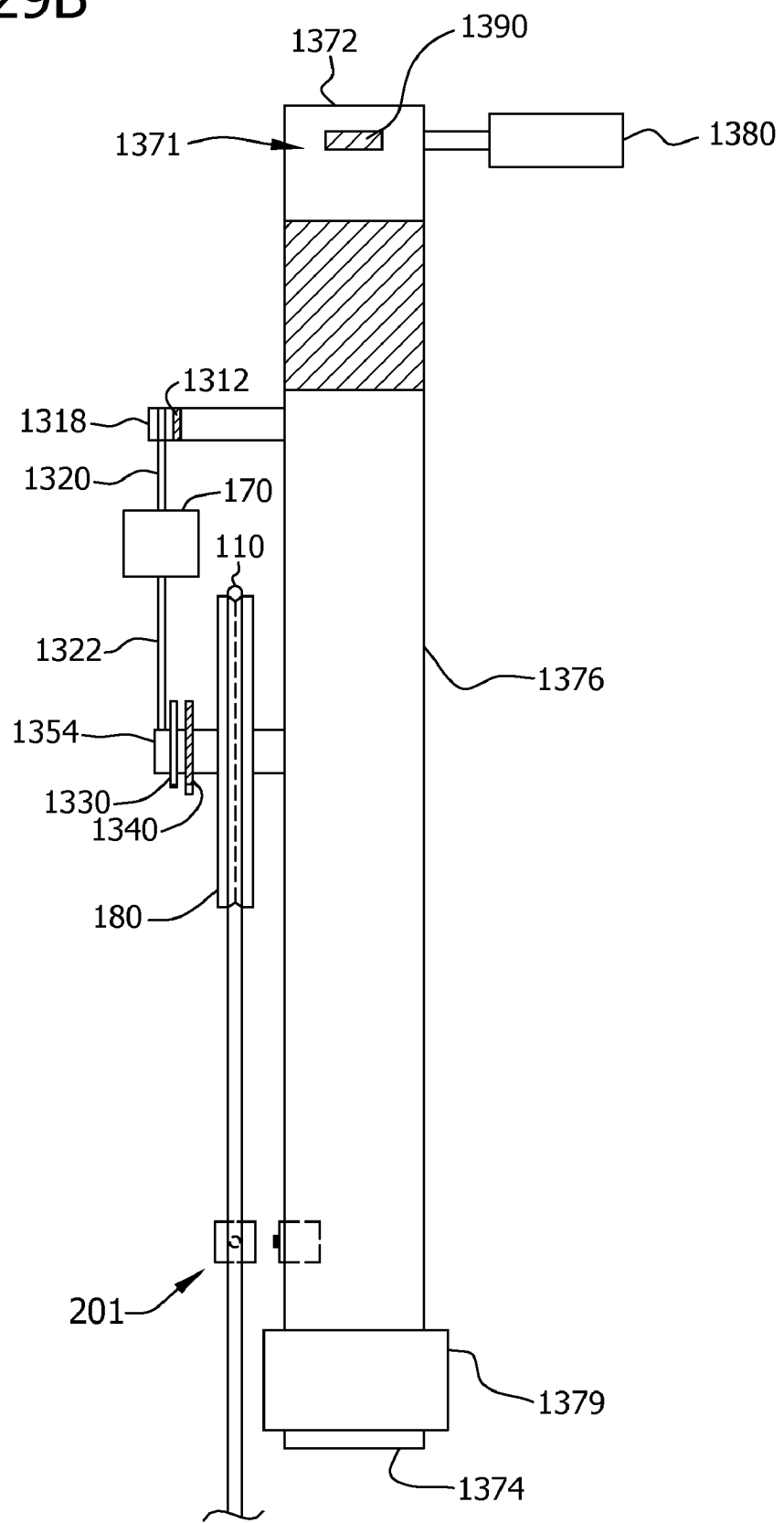
FIG. 29B is a cross-section taken in the plane of 29B-29B of FIG. 29A.

FIG. 29A shows a pulling system 1300 in an initial position. FIG. 29B is a cross-section taken in the plane of 29B-29B of FIG. 29A. A dampening system 1370 is used to dampen pendular motion of the cable 110 without contacting the cable 110 below the load cell pulley 140. The pulling system 1300 may include the same components as those of FIGS. 25A and 25B. The components include: the cable 110, the load cell pulley 140, the load cell 170, the idler pulley 180, the drum 200, the position sensor 201, an actuator link 1302, an actuator 1310, an upper arm 1312, an upper arm center coupling 1314, an upper arm first end 1316, an upper arm second end 1318, a first connector 1320, a second connector 1322, the third connector 1324, a first lower arm 1330 having a distal end 1332 and a proximal end 1334, a second lower arm 1340 having distal end 1342 and a proximal end 1344, a center coupling 1354, and an additional pulley 1360. However, unlike the embodiments described above, multiple components of the pulling system 1300 are coupled to the dampening system 1370 instead of the frame.

The dampening system 1370 differs from the bushing 203 described above in that the dampening system facilitates dampening of pendular motion of the cable 110 without physically contacting the cable at any point below the load cell pulley 140. Accordingly, frictional forces are not imparted on the cable 110 by the dampening system 1370, thus reducing the sources of error introduced into the calculation of the weight of the object suspended from the cable 110.

Additionally, the position sensor 201 described above is used in conjunction with the dampening system 1370 to sense pendular motion of the cable 110. The dampening system 1370 includes a mounting member 1371 having an upper section 1372, a lower section 1374 (FIG. 29B), and a middle section 1376. The upper arm center coupling 1314 is rotatably coupled to the mounting member 1371 at or near either the upper section 1372 or middle section 1376. The center coupling 1354 is rotatably coupled to the mounting member 1371 at or near the middle section 1376. The actuator 1310 is also coupled to the mounting member 1371 at or near the upper section 1372. While the drum 200 and other components of the dampening system 1370 (discussed in detail below) are coupled to the frame of the pulling system 1300, the other components of the pulling system 1300 are not coupled to the frame.

The mounting member 1371 is coupled to the frame by a joint 1379 at or near the lower section 1374 such that the upper section 1372 of the mounting member can translate relative to the frame. As shown in FIG. 29B, one end of the joint 1379 is secured to the mounting member 1371 such that the upper section 1372 of the mounting member is able to move relative to the lower section 1374, but is otherwise restricted from movement with respect to the frame (e.g., it cannot rotate about the longitudinal axis of the mounting member). A second end of the joint 1379 is rigidly coupled to the frame of the pulling system 1300. In another embodiment, a ball-and-socket or heim joint are used to couple the mounting member 1371 to the frame.

A first actuator 1380 is coupled at one end to the upper section 1372 of the mounting member 1371. Another portion of the first actuator 1380 is coupled to the frame. A second actuator 1390 is oriented approximately perpendicular to the first actuator 1380 and is likewise coupled at one end to the upper section 1372 of the mounting member 1371. Together, the actuators 1380, 1390 are operable to displace the mounting member 1371. Moreover, the actuators 1380, 1390 may be rotatably coupled to the upper section 1372 of the mounting member and rigidly coupled to the frame. The actuators 1380, 1390 may be of any suitable type, such as linear actuators. The actuators 1380, 1390 may be controlled by the control system 320 and/or processor 300.

The actuators 1380, 1390 in conjunction with the joint 1379 facilitate the pivoting of the mounting member 1371 about the joint 1379. As the upper arm center coupling 1314 and center coupling 1354 are rotatably coupled to the mounting member 1371, the pivoting of the mounting member 1371 results in corresponding movement of the first lower arm 1330, second lower arm 1340, and upper arm 1312 as well as the other components of the pulling system 1300 coupled thereto. These components include the cable 110, the load cell pulley 140, the load cell 170, the idler pulley 180, the actuator link 1302, the actuator 1310, the first connector 1320, the second connector 1322, the third connector 1324, and the additional pulley 1360.

Figure 30:
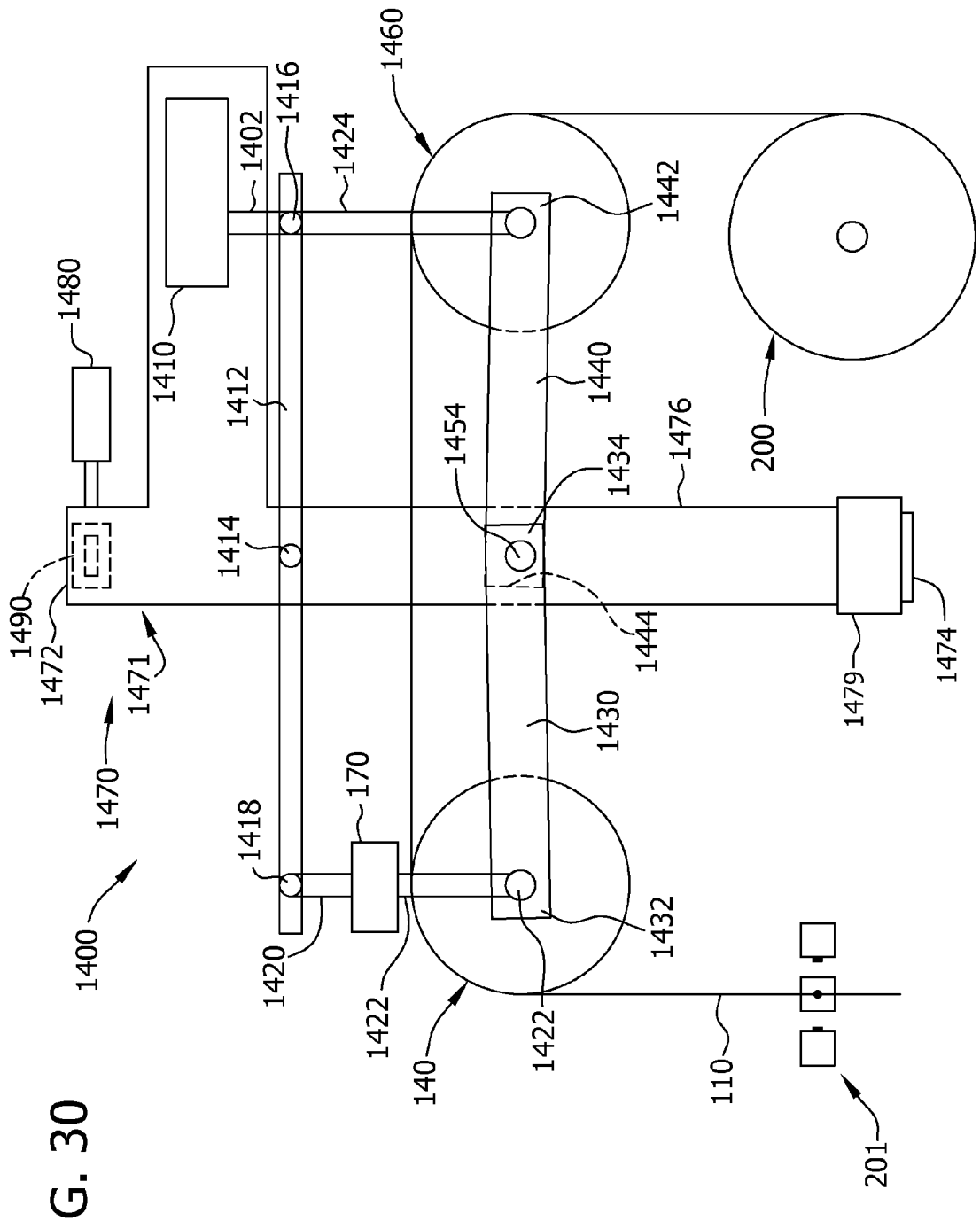
FIG. 30 is a side view of another embodiment of a dampening pulling system in an initial position.

FIG. 30 shows another arrangement of a pulling system 1400 in the initial position. The pulling system 1400 may include the same components as those of FIGS. 29A and 29B, with the exception of the idler pulley 180. The components include: the cable 110, the load cell pulley 140, the load cell 170, the drum 200, the position sensor 201, an actuator link 1402, an actuator 1410, an upper arm 1412, an upper arm center coupling 1414, an upper arm first end 1416, an upper arm second end 1418, a first connector 1420, a second connector 1422, a third connector 1424, a first lower arm 1430 having a distal end 1432 and a proximal end 1434, a second lower arm 1440 having distal end 1442 and a proximal end 1444, a center coupling 1454, an additional pulley 1460, a dampening system 1470, a mounting member 1471 having a lower section 1474, middle section 1476, and upper section 1472, a joint 1479, a first actuator 1480, and a second actuator 1490.

The embodiment of FIG. 30 differs from that of FIGS. 29A and 29B in that an idler pulley is not included. Instead, the first lower arm 1430 and second lower arm 1440 are pivotably coupled to the mounting member 1471 at or near the middle section 1476 of the mounting member.

Figure 31:
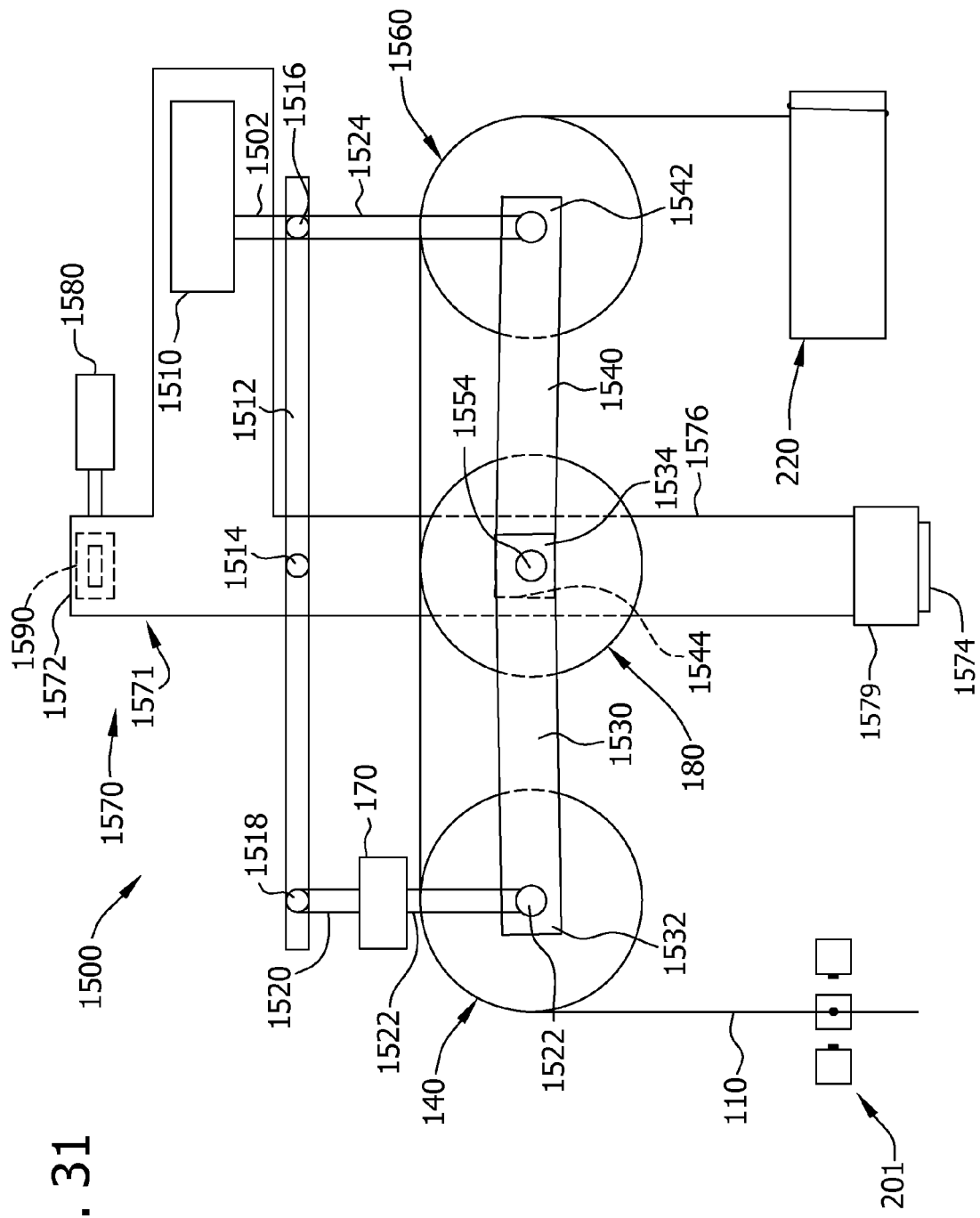
FIG. 31 is a side view of another embodiment of a dampening pulling system in an initial position.

FIG. 31 shows another embodiment of a pulling system 1500 in an initial position. The pulling system 1500 is capable of translation between an upper and lower position as described above in relation to FIGS. 29A-30. The pulling system 1500 utilizes the same components as those of FIGS. 29A and 29B. The components include: the cable 110, the load cell pulley 140, the load cell 170, the idler pulley 180, the drum 200, the position sensor 201, an actuator link 1502, an actuator 1510, an upper arm 1512, an upper arm center coupling 1514, an upper arm first end 1516, an upper arm second end 1518, a first connector 1520, a second connector 1522, a third connector 1524, a first lower arm 1530 having a distal end 1532 and a proximal end 1534, a second lower arm 1540 having distal end 1542 and a proximal end 1544, a center coupling 1554, an additional pulley 1560, a dampening system 1570, a mounting member 1571 having a lower section 1574, middle section 1576, and upper section 1572, a joint 1579, a first actuator 1580, and a second actuator 1590.

The pulling system 1500 differs from those described above in that a drum 220 is rotated by approximately 90 degrees with respect to the position of the drum 200 in the other pulling systems. Accordingly, the center axis of the drum 220 lies in a plane that is perpendicular to a plane or planes containing the center axes of the other pulleys 140, 180, 1560 in the pulling system 1500. According to some embodiments, the drum 220 is mounted on a splined shaft and is able to slidably move along the shaft in a direction parallel to its axis of rotation to maintain a perpendicular angle between the cable 110 and the outer surface of the drum. In other embodiments, the drum may instead of sliding along its axis of rotation and instead have grooves formed therein that result in a continually changing pitch. From the perspective shown in FIG. 31, the pitch of the grooves would increase as they progressed from right to left along the outer surface of the drum 220.

Figure 32:
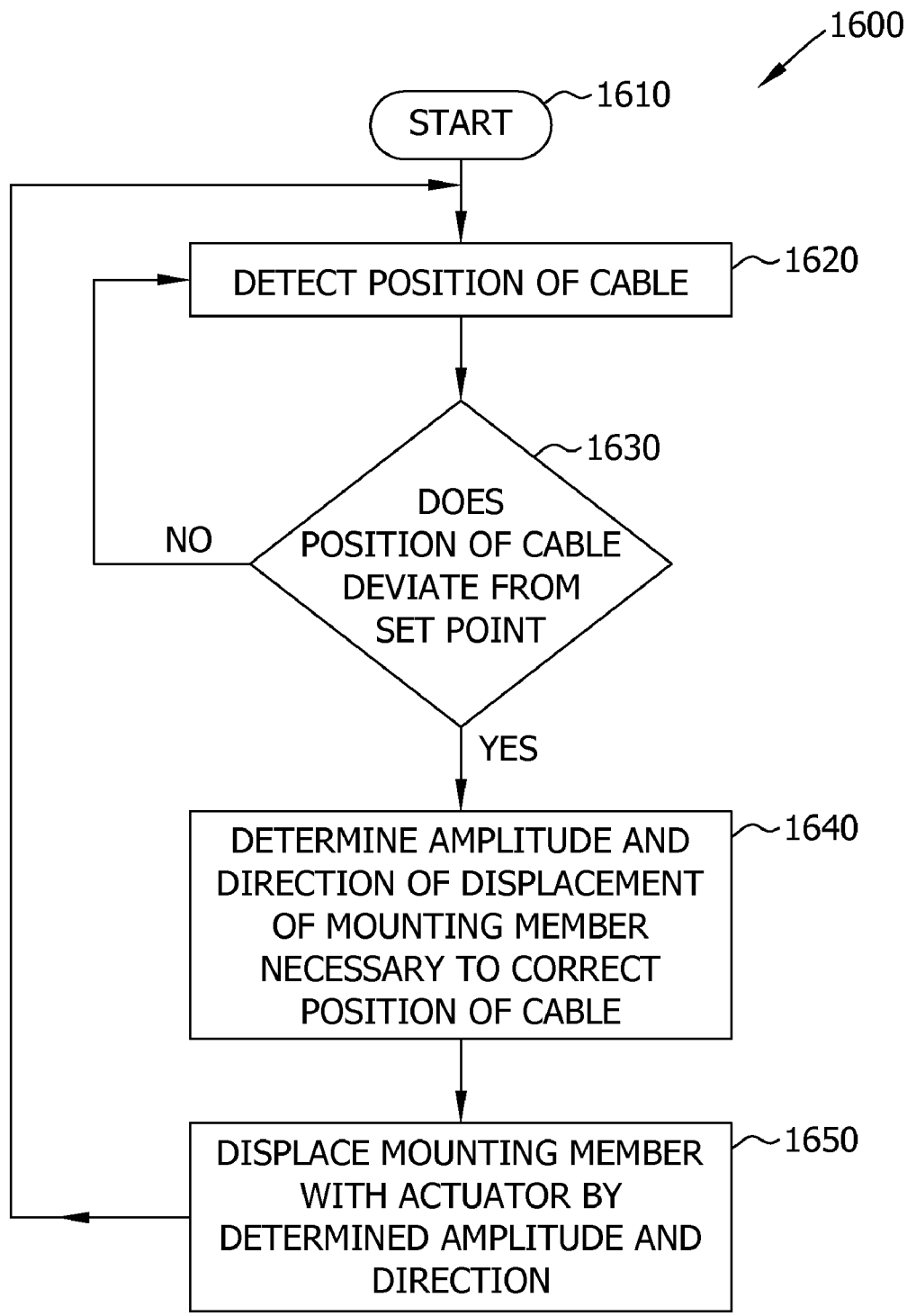
FIG. 32 is a flow diagram of a method for dampening pendular motion of a pull cable.

FIG. 32 depicts a flow diagram for a method 1600 of actively controlling the position of the cable 110. The method 1600 permits the control of the position of the cable 110 without contacting the cable with a bushing or other similar apparatus. The method 1600 may be performed by the control system 320 and processor 300 described above in relation to FIG. 19. The method 1600 is operable to control the position of the cable 110 in relation to the frame 1300 using the dampening system 1370 described above in relation to FIGS. 29, or any of the other dampening systems 1470 and 1570 described in FIGS. 30 and 31. Reference herein will be made to the use of the method 1600 in the pulling system 1300 of FIG. 29, although the method 1600 is equally well-suited to the pulling systems 1400, 1500 described in FIGS. 30 and 31, respectively.

The method 1600 begins at block 1610 and the position of the cable 110 is detected 1620. The method 1600 may be used at any point before, during, or after the object attached to the cable 110 is lifted. Moreover, the method 1600 may be used to perform an initial alignment of the pulling system 1300 before pulling an object upward in order to compensate for any manufacturing defects in the components of the pulling system that would cause orbital or pendular motion of the cable 110. Accordingly, the pulling system 1300 components could be manufactured at less stringent tolerances (i.e., numerically higher tolerances), and correspondingly lower costs, since the pulling system can be aligned through the method 1600.

Returning to the method 1600, the position of the cable 110 with respect to the frame 130 is detected by the position sensor 201 at block 1620. The position sensor 201 is operable to detect the position of the cable in two dimensions. As described above, the position sensors 201 may use a masked photo diode arrangement to detect the position of the cable 110 with respect to the frame 130. Other systems may be used to detect the position of the cable 110 with respect to the frame 130 without departing from the scope of the embodiments.

At block 1630, a determination is made of whether the cable 110 is in a position that deviates from a set point (i.e., a desired position). A tolerance may be allowed, such that the cable can deviate from the set point by a predefined amount and still be considered not to deviate from the set point for the purposes of the method 1600. The set point indicates a position that the cable 110 is in when it is not exhibiting pendular or orbital motion. In one embodiment, the set point is determined before raising the object by detecting the position of the cable 110 while the pulling system 1300 and the object attached to the end of the cable 110 are at rest. The set point in such embodiments is constant, and does not change as the frame is rotated or the object is raised. In other embodiments, the set point may vary as the frame rotates to accommodate for manufacturing imperfections, eccentricities, misalignments, or other system configurations that may contribute to the generation of orbital or pendular motion in the cable as the frame is rotated. The set point then may vary at different points during one revolution of the frame.

The deviation from the set point is in some embodiments a sinusoidal function of time. The frequency, amplitude, and phase of the sinusoidal deviation are determined by the processor 300 of the control system 320 by analyzing the signals from the position sensor 201 (FIG. 19).

Referring to FIG. 32, if a determination is made in block 1630 that the position of the cable 110 does not deviate from the set point, the method returns to block 1620 where the position of the cable is again detected. This determination in block 1630 may occur at any suitable frequency, such as 30 to 60 times per second, or continuously if the processor 300 is an analog system. However, if the position of the cable 100 does deviate from the set point, the method 1600 proceeds on to block 1640.

In block 1640, a determination is made by the control system 320 and/or processor 300 of the amplitude and direction of displacement of the mounting member 1371, and the pulley 140 coupled thereto, as a function of time necessary to correct the position of the cable 110 such that it does not deviate from the set point. The control system 320 calculates the amplitude of the displacement of either of the actuators 1380, 1390 necessary to displace the mounting member 1371 and load cell pulley 140 as the load cell pulley is coupled by other components of the pulling system 1300 to the mounting member.

The required amplitude and direction of displacement as a function of time of the first actuator 1380 and second actuator 1390 is then determined by the control system 320 and/or processor 300 in order to correct the position of the cable 110. In making this determination, the control system 320 and/or processor 300 calculates the required displacement of the actuators 1380, 1390 necessary to correct the position of the cable 110 by taking into account the geometry of the components of the pulling system 1300. The control system 320 and/or processor 300 is thus able to calculate the displacement of the actuators 1380, 1390 which is necessary to move or correct the position of the cable 110.

If the deviation of the cable 110 is sinusoidal, then the motion of the cable is dampened by displacing the mounting member 1371 in the same direction as the motion but at a lesser amplitude and lagging the motion by approximately one quarter of a cycle (i.e., 90 degrees out of phase) as shown in FIG. 7. The determined amplitude of displacement of the mounting member 1371 may be chosen to affect the dampening action within a chosen time and thus multiple movements of the mounting member 1371 may be required. The displacement of the movements of the mounting member 1371 may thus decrease over time, and therefore progressively dampen the motion of the cable 110.

The mounting member 1371 is then displaced in the determined amplitude and direction as a function of time by the actuators 1380, 1390 at block 1650. The method 1600 then returns to block 1620 where the position of the cable is detected again.

This written description uses examples to disclose the invention, including the best mode, and also to enable any person skilled in the art to practice the invention, including making and using any devices or systems and performing any related methods. The patentable scope of the invention may include other examples that occur to those skilled in the art. Such other examples are intended to be within the scope of the invention.

The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of the present invention or the embodiments thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description and shown in the accompanying drawings shall be interpreted as illustrative and not in a limiting sense.

What is claimed is:

1. An apparatus for measuring the weight of an object while pulling the object upward, the apparatus comprising:
   a frame having a vertical axis and a horizontal axis, the vertical axis parallel to an axis along which the object is pulled, the horizontal axis being orthogonal to the vertical axis;
   a cable coupled to the object;
   a first cylinder rotatably connected to the frame, at least a portion of the cable engaging a surface of the first cylinder;
   a second cylinder rotatably connected to the frame, at least a portion of the cable engaging a surface of the second cylinder;
   an upper arm having a first end, a second end, the upper arm coupled to the frame;
   a lower arm coupled at one end to the first cylinder and at another end to the frame;
   an actuator coupled to the upper arm;
   a force measurement device for measuring the weight of the object, the force measurement device coupled to the first cylinder; and
   wherein the actuator is operable to lower and raise the force measurement device, the first cylinder, and the second cylinder, and wherein the lower arm substantially restrains the first cylinder from movement parallel to the horizontal axis.

2. The apparatus of claim 1 wherein the object is a silicon ingot.

3. The apparatus of claim 1 wherein the upper arm has a mid-point and the upper arm is coupled to the frame at the mid-point.

4. The apparatus of claim 1 wherein the lower arm includes a first lower arm having a first end and a second end, the first end coupled to the first cylinder and the second end coupled to the frame and a second lower arm having a first end and a second end, the first end coupled to the second cylinder and the second end coupled to the frame.

5. The apparatus of claim 4 further comprising a spool, the cable traveling over the spool after it has traveled over the first cylinder and second cylinder, the second end of the cable coupled to at least a portion of the spool and the cable coiled around the spool.

6. The apparatus of claim 5 wherein the spool is rotatable about a center axis disposed in a first plane and the first cylinder and second cylinder are rotatable about respective center axes disposed in a second plane.

7. The apparatus of claim 6 wherein the first plane is generally perpendicular to the second plane.

8. The apparatus of claim 1 further comprising a bushing at least partially surrounding a portion of the cable, the bushing configured to control the position of the cable.

9. The apparatus of claim 8 wherein the bushing is configured to control at least one of pendular motion of the cable and orbital motion of the cable.

10. The apparatus of claim 8 wherein the bushing is movable between a first position in which the bushing is in contact with the cable and a second position in which the bushing is not in contact with the cable.

11. The apparatus of claim 1 further comprising at least one position sensor configured to detect the position of the cable with respect to the frame.

12. The apparatus of claim 1 further comprising a puller for pulling the object upward.

13. An apparatus for measuring the weight of an object while pulling the object upward, the apparatus comprising:
   a frame having a vertical axis and a horizontal axis, the vertical axis parallel to an axis along which the object is pulled, the horizontal axis being orthogonal to the vertical axis;
   a cable coupled to the object;
   a mounting member having a lower section and an upper section, the mounting member pivotably coupled at the lower section to the frame;
   a first cylinder within the frame, at least a portion of the cable engaging a surface of the first cylinder;
   a second cylinder within the frame, at least a portion of the cable engaging a surface of the second cylinder;
   an upper arm having a first end and a second end, the upper arm coupled to the mounting member;
   a lower arm coupled at one end to the first cylinder and at another end to the frame;
   an actuator having a first end and a second end, the first end coupled to the mounting member and the second end coupled to the first end of the upper arm;
   a force measurement device for measuring the weight of the object, the force measurement device coupled to the first cylinder at a first end and to the second end of the upper arm at a second end; and wherein the actuator is operable to raise and lower the force measurement device, the first cylinder, and the second cylinder.

14. The apparatus of claim 13 wherein the object is a silicon ingot.

15. The apparatus of claim 13 wherein the lower arm includes a first lower arm having a first end and a second end, the first end coupled to the first cylinder and the second end coupled to the mounting member and a second lower arm having a first end and a second end, the first end coupled to the second cylinder and the second end coupled to the mounting member.

16. The apparatus of claim 15 further comprising a first mounting member actuator having a first end and a second end, the first end coupled to the upper section of the mounting member and the second end coupled to the frame.

17. The apparatus of claim 16 further comprising a second mounting member actuator having a first and a second end, the first end coupled to the upper section of the mounting member and the second end coupled to the frame.

18. The apparatus of claim 17 wherein the first mounting member actuator is operable to move the upper section of the mounting member in a first plane and the second mounting member actuator is operable to move the upper section of the mounting member in a second plane different from the first plane.

19. The apparatus of claim 13 further comprising a bushing at least partially surrounding a portion of the cable, the bushing configured to control the position of the cable.

20. The apparatus of claim 19 wherein the bushing is configured to control at least one of pendular motion of the cable and orbital motion of the cable.

21. The apparatus of claim 19 wherein the bushing is movable between a first position in which the bushing is in contact with the cable and a second position in which the bushing is not in contact with the cable.

22. An apparatus for measuring the weight of an object while pulling the object upward, the apparatus comprising:
  a puller for pulling the object, the puller including:
    a frame;
    a cable coupled to the object;
    a first cylinder rotatably coupled to the frame, at least a portion of the cable engaging the first cylinder;
    a second cylinder rotatably coupled to the frame, at least a portion of the cable engaging the second cylinder; and
    an arm having a longitudinal axis connecting a first end and a second end, the first end coupled to the frame and the second end coupled to the first cylinder, the longitudinal axis being substantially parallel to a path travelled by the cable between the first cylinder and the second cylinder;
  an actuator having a first end and a second end, the first end coupled to the frame;
  a force measurement device for measuring the weight of the object, the force measurement device coupled to the first cylinder at a first end and to the second end of the actuator at a second end; and
  wherein the actuator is operable to lower and raise the force measurement device and the first cylinder and wherein the arm substantially restrains the first cylinder from movement parallel to the longitudinal axis of the arm.

23. The apparatus of claim 22 wherein the object is a growing silicon ingot.

24. The apparatus of claim 22 further comprising further comprising a bushing at least partially surrounding a portion of the cable, the bushing configured to control the position of the cable.

25. The apparatus of claim 24 wherein the bushing is movable between a first position in which the bushing is in contact with the cable and a second position in which the bushing is not in contact with the cable.

26. The apparatus of claim 22 wherein the frame is rotatable about a vertical axis parallel to an axis along which the object is pulled.

27. The apparatus of claim 22 further comprising at least one position sensor configured to detect the position of the cable with respect to the frame.

* * * * *